United States Patent [19]
Sahara et al.

[11] Patent Number: 5,608,233
[45] Date of Patent: Mar. 4, 1997

[54] OPTICAL DEVICE FOR MAGNETO-OPTICAL DISC SYSTEM

[75] Inventors: Kenji Sahara; Hironobu Narui; Masato Doi; Osamu Matsuda, all of Kanagawa, Japan

[73] Assignee: Sony Corporation, Tokyo, Japan

[21] Appl. No.: 429,828

[22] Filed: Apr. 27, 1995

[30] Foreign Application Priority Data

Apr. 28, 1994 [JP] Japan ................................. 6-092559

[51] Int. Cl.⁶ ...................... H01L 27/15; H01L 31/12; H01L 31/153; H01L 33/00
[52] U.S. Cl. ...................... 257/80; 257/84; 257/85; 257/98; 257/432; 372/50; 372/99; 372/101; 372/102; 369/109; 369/110; 369/122
[58] Field of Search ................ 257/80, 82, 84, 257/85, 98, 432; 372/50, 99, 101, 102; 369/121, 122, 109, 110

[56] References Cited

U.S. PATENT DOCUMENTS

| | | | |
|---|---|---|---|
| 5,233,595 | 8/1993 | Kawakubo | 369/122 X |
| 5,349,210 | 9/1994 | Ackley et al. | 257/84 |
| 5,352,919 | 10/1994 | Takano | 257/80 X |
| 5,406,543 | 4/1995 | Kobayashi et al. | 257/85 X |

OTHER PUBLICATIONS

No Author, "Vertically Emitting Diode Laser with Integrated Front–Beam Monitor Photodiode," *IBM Technical Disclosure Bulletin*, vol. 32, No. 8A, Jan. 1990, pp. 149–150.

*Primary Examiner*—William Mintel
*Attorney, Agent, or Firm*—Hill, Steadman & Simpson

[57] ABSTRACT

An optical device for detecting a magneto-optical signal can be simplified and miniaturized in arrangement. An optical device for detecting a magneto-optical signal includes an optical element (101) in which a light-emitting portion (4) and a light-receiving portion (5) are closely disposed on a common substrate and in which reflected-back light obtained from a magneto-optical medium (34) after light emitted from the light-emitting portion (4) was reflected on the magneto-optical medium (34) is detected at a position near confocal position by the light-receiving portion (5). The light-receiving portion (5) on the optical element (1) has a light-receiving surface inclined relative to the optical axis of the reflected-back light formed thereon so that the light-receiving portion has a polarization selective transmittance function on its surface. Thus, the reflected-back light from the magneto-optical medium (34) can be received and detected by the light-receiving portion (5) on the optical element (101).

16 Claims, 18 Drawing Sheets

OPTICAL DEVICE FOR MAGNETO-OPTICAL DISC SYSTEM

BACKGROUND OF THE INVENTION

The present invention relates to optical devices for detecting a magneto-optical signal and, particularly to an optical device having a novel optical element.

Optical devices, i.e., magneto-optical pickup portions of so-called magneto-optical disc drives use polarizing elements, such as a Wollaston polarizing prism and a polarizing beam splitter (PBS) to assemble optical assemblies in a hybrid fashion. Therefore, an overall arrangement of a magneto-optical pickup becomes complicated and large. Furthermore, optical layout of optical assemblies have to be set with high alignment accuracy.

In addition, each optical element is expensive and the magneto-optical pickup is difficult to be made inexpensive.

OBJECTS AND SUMMARY OF THE INVENTION

In view of the aforesaid aspect, it is an object of the present invention to provide an optical device for detecting a magneto-optical signal in which the number of optical assemblies can be reduced and in which optical layout of optical assemblies can be set easily with high alignment accuracy.

It is another object of the present invention to provide an optical device whose overall arrangement can be simplified and miniaturized.

It is a further object of the present invention to provide an optical device which can be made inexpensive.

According to an aspect of the present invention, there is provided an optical device 4 for detecting a magneto-optical signal which is comprised of an optical element having a common substrate, a light-emitting portion and a light-receiving portion, the light-emitting portion and the light-receiving portion being closely disposed on the common substrate and the light-receiving portion receiving and detecting near a confocal point reflected-back light obtained from a magneto-optical medium after light emitted from the light-emitting portion was reflected on the magneto-optical medium, wherein the light-receiving portion on the optical element receives the reflected-back light from the magneto-optical medium to detect a magneto-optical signal.

DETAILED DESCRIPTION OF THE PREFERRED EMBODIMENTS

Figure 1:
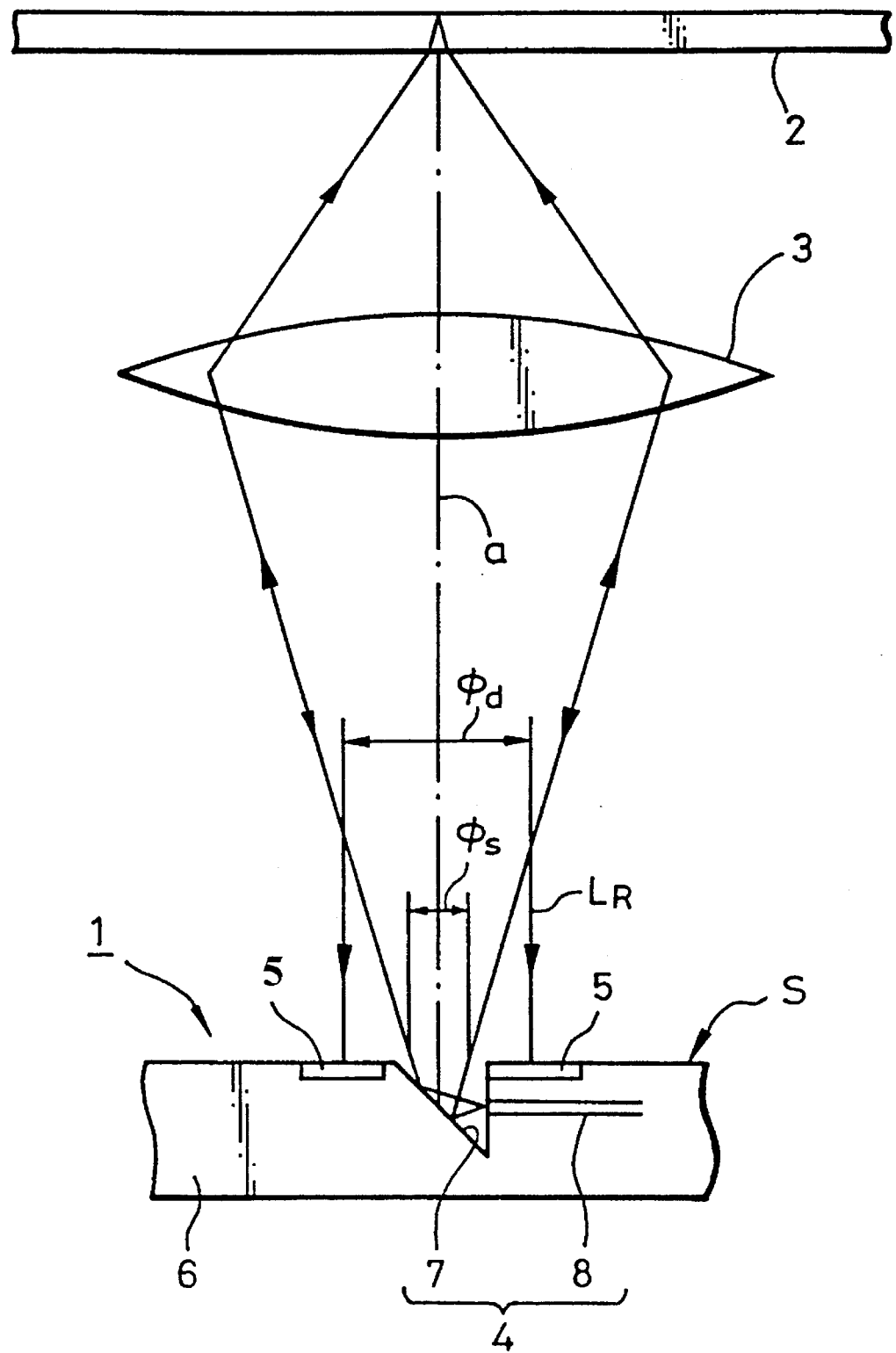
FIG. 1 is a schematic diagram used to explain an optical element used in the present invention.

An optical device according to the present invention will hereinafter be described with reference to the drawings.

Referring to the drawings in detail and initially to FIGS. 1 to 9, a fundamental arrangement of a novel optical element for use with an optical device according to the present invention will be described hereinafter.

In FIG. 1, reference numeral 1 designates an optical element, 2 a radiated portion, such as an optical recording medium and 3 a converging means, i.e., condenser optical lens.

As shown in FIG. 1, an optical element 1 is composed of a light-emitting portion 4 and a light-receiving portion 5 which are integrally formed on a common substrate 6. Light emitted from the light-emitting portion 4 is converged and radiated on the radiated portion 2. Reflected-back light reflected from the radiated portion 2 is converged by the converging means 3 and received by a light-receiving portion 5 disposed at the position near confocal of the converging means 3. With the above-mentioned arrangement, light emitted from the light-emitting portion 4 is passed through an optical path of the same axis and received by the light-receiving portion 5 before and after light is reflected on the radiated portion 2, as shown by a one-dot chain line a in FIG. 1.

In this optical element 1, the light-emitting portion 4 is composed of a semiconductor laser 8 having a horizontal resonator and a reflecting mirror 7. The light-receiving portion 5 is composed of a photodiode (PD). The semiconductor laser 8 uses the reflecting mirror 7 to reflect emitted light so that the emitted light is agreed with the optical path through which the emitted light can travel toward the radiated portion 2.

Reflected-back light LR traveling toward the light-receiving portion 5 is converged up to near a light diffraction limit. The light-receiving portion 5 is disposed such that at least a part of the light-receiving surface thereof is placed within this light diffraction limit, i.e., a part of the light-receiving surface thereof is placed at the position at which a distance of light passing through a disposing reference plane S of the light-receiving surface after light was emitted from the light-emitting portion 4 from the optical axis a falls within $1.22\lambda/NA$ where $\lambda$ is the wavelength of light emitted from the light-emitting portion 4 and NA is the numerical aperture of the converging means 3.

Figure 2:
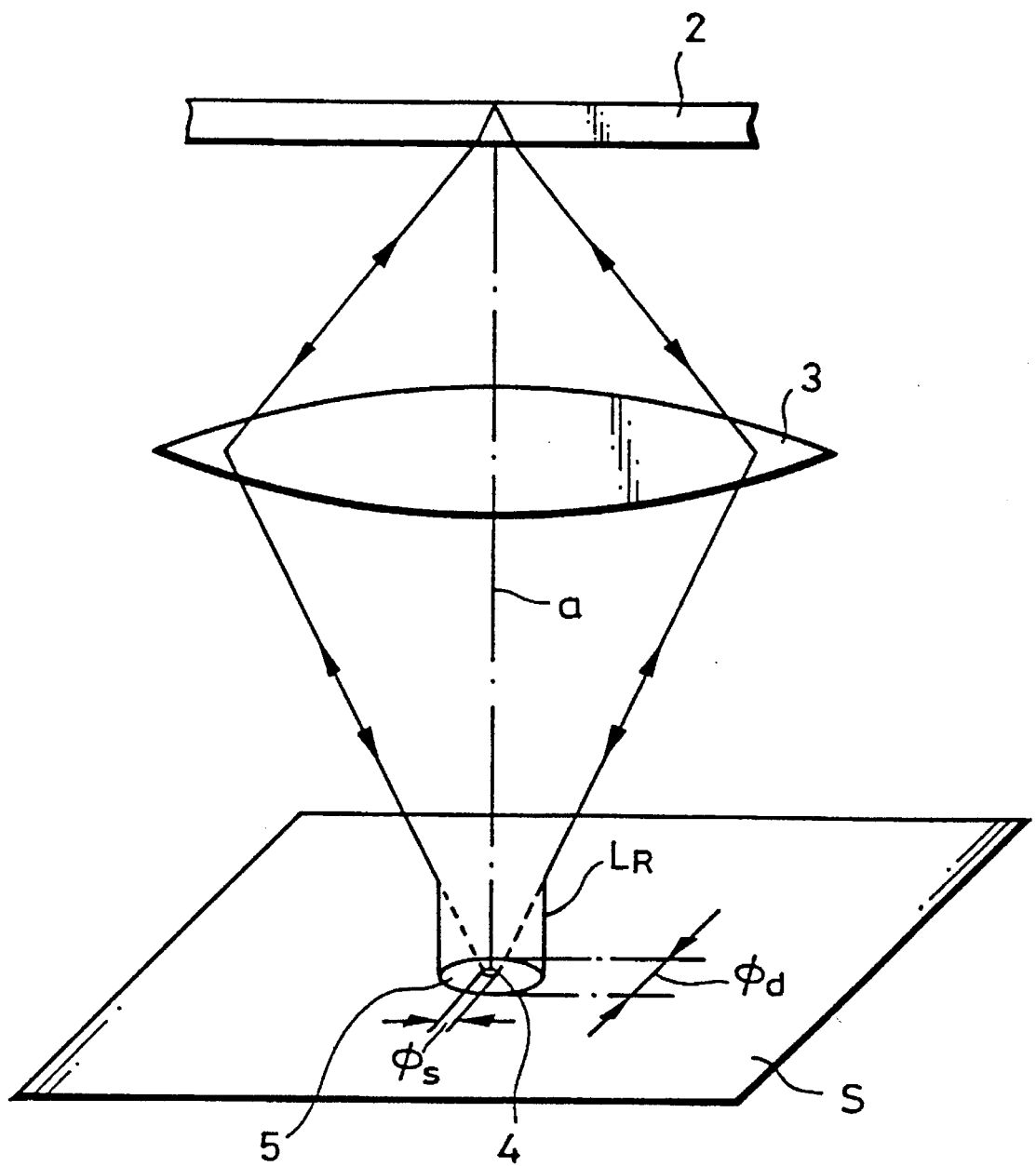
FIG. 2 is a schematic diagram used to explain a fundamental arrangement of the optical element used in the present invention.

Moreover, in this case, as shown in FIGS. 1 and 2, a diameter $\phi_s$ of light emitted from the light-emitting portion 4 on the disposing reference surface S of the light-receiving surface of the light-receiving portion 5 is selected to be smaller than a diameter $\phi_d$ of the light diffraction limit so that the effective light-receiving surface of the light-receiving portion 5 is placed outside the diameter $\phi_s$ of the light thus emitted. If a semiconductor laser is used as a light source of the light-emitting portion 4, then the diameter $\phi_s$ of the emitted light can range from about 1 to 2 μm. If on the other hand the numerical aperture NA of the converging means 3 ranges from 0.09 to 0.1 and the wavelength $\lambda$ of the emitted light is about 780 nm, then the diffraction limit, i.e., $\phi_d$ becomes about $1.22\lambda k/NA=10$ μm.

Then, the light-emitting portion 4 is disposed at the focus position of the converging means 3. To be more concrete, a so-called waist of light emitted from the semiconductor laser 8 is placed at the confocal position. The radiated portion 2 is placed at the position of the other focus of the converging means 3.

In this optical device 1, if light emitted from the light-emitting portion 4 is radiated on an optical recording medium of the radiated portion 2 disposed at the confocal position through the converging means 3, i.e., condenser optical lens, then reflected-back light of light reflected from the radiated portion 2 of the optical recording medium, i.e., reflected-back light including recorded information is converged again by the converging means,3 and introduced into the photodiode of the light receiving portion 5 disposed near the confocal position. This reflected-back light is received and detected by the light-receiving portion 5, i.e., the reflected-back light is converted to an electrical signal and output as a reproduced signal.

At that time, if the light-receiving surface of the photodiode of the light-receiving portion 5 is disposed at the position including a region in which a distance from the optical axis a is larger than $\phi s/2$ and lies within $\phi_d/2$, then it becomes possible to reliably separate and detect the reflected-back light from the radiated portion 2 and the emitted light by the light-receiving portion 5.

If this optical element 1 has the structure such that the light-emitting portion 4 and the light-receiving portion 5 are integrally formed on the common substrate 6 as described above, then it is possible to easily and reliably set the light-emitting portion 4 and the light-receiving portion 5 with a predetermined positional relationship satisfactorily.

A typical example of a method of manufacturing the optical element 1 will be described below. In this example, the optical element 1 is manufactured by selective MOCVD (metal organic chemical vapor deposition).

Figure 3A:
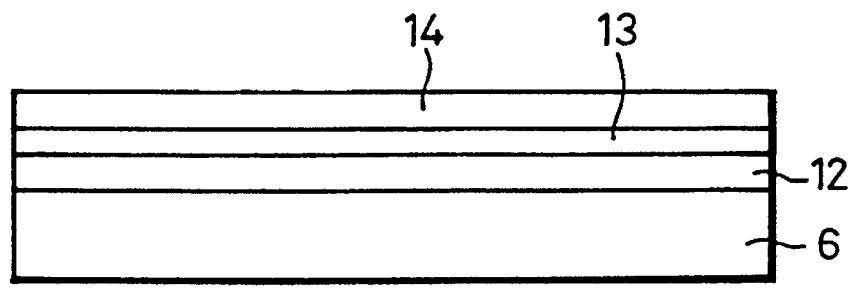
FIGS. 3A through 3C are process diagrams showing a first process of an example of a method of manufacturing an optical element used in the present invention, respectively.

As shown in FIG. 3A, semiconductor layers forming a semiconductor laser are epitaxially grown on a substrate 6 formed of a GaAs substrate of a first conductivity type, i.e., n-type having (100) crystal plane as a major surface. Specifically, there is formed a laminated semiconductor layer in which an AlGaAs first cladding layer 12 of the same conductivity type as that of the GaAs substrate 6, a GaAs active layer 13 and a second cladding layer 14 of a second conductivity type different from the conductivity type of the first cladding layer 12 of, for example, p type are epitaxially grown on the GaAs substrate 6 by proper method, such as MOCVD, in that order.

Figure 3B:
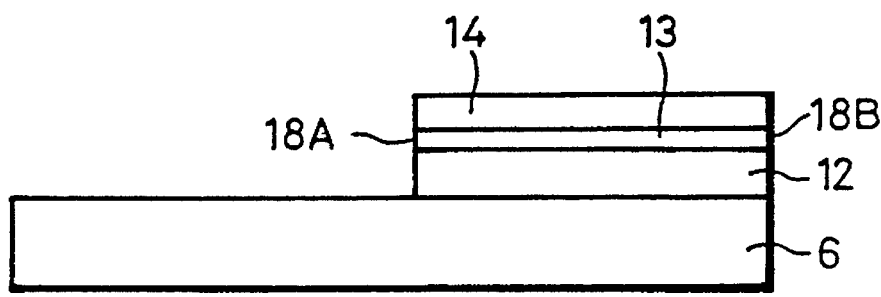

Then, as shown in FIG. 3B, the semiconductor layers 14, 13 and 12 thus epitaxially grown on the GaAs substrate 6 are left as a semiconductor laser LD and removed at their portions where the reflecting mirror 7 is finally formed by etching, such as RIE (reactive ion etching). An end face of the semiconductor layer formed by the etching surface is employed as one resonator end face 18A of the semiconductor laser LD. A surface opposing the end face 18A is formed as the other resonator end face 18B by RIE. A horizontal resonator of a semiconductor laser is constructed between the two end faces 18A and 18B. In this case, though not shown, current blocking regions are formed by implanting impurity ions so as to sandwich a region which finally constructs the resonator of the semiconductor laser.

Figure 3C:
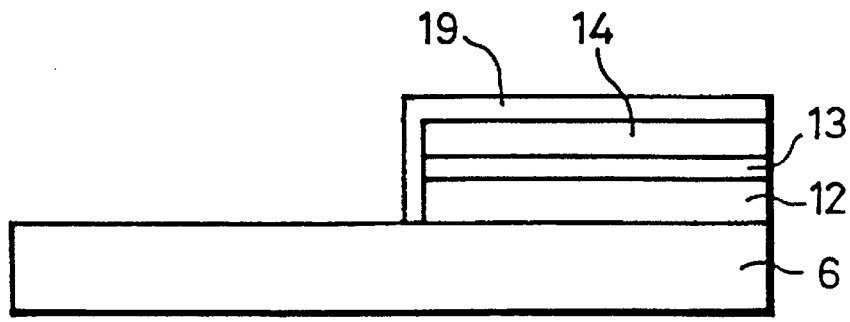

As shown in FIG. 3C, a mask layer 19 for selective MOCVD, e.g., an insulating layer of $SiO_2$ and SiN or the like is deposited so as to cover the laminated semiconductor layer left on the substrate 6, i.e., the portion in which the semiconductor laser LD is formed.

Figure 4A:
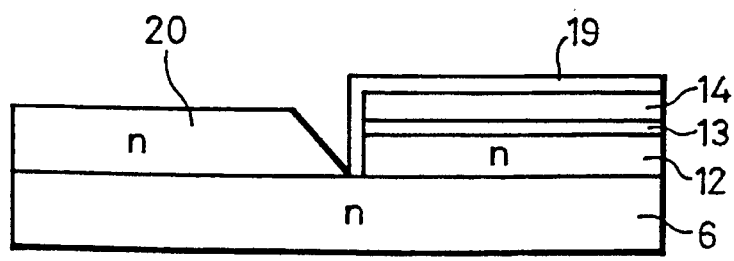
FIGS. 4A through 4C are process diagrams showing a second process of an example of a method of manufacturing an optical element used in the present invention, respectively.

As shown in FIG. 4A, a first conductivity type, e.g., n-type GaAs first semiconductor layer 20 is formed on the substrate 6 at its portion which is not covered with the mask layer 19 by selective MOCVD.

Figure 4B:
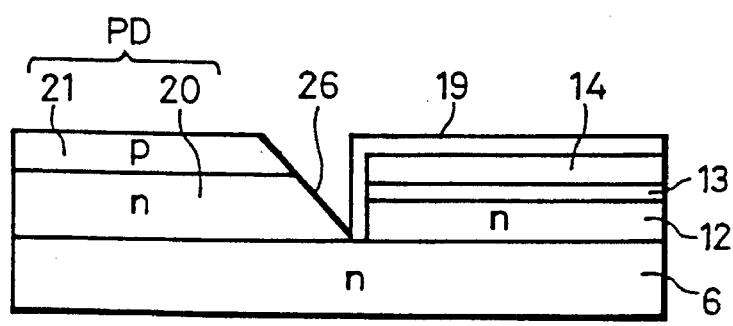

Subsequently, as shown in FIG. 4B, a second conductivity type, e.g., p-type GaAs second semiconductor layer 21 is formed on the first semiconductor layer 20 by selective MOCVD. The first and second semiconductor layers 20 and 21 constitute a photodiode PD.

Figure 4C:
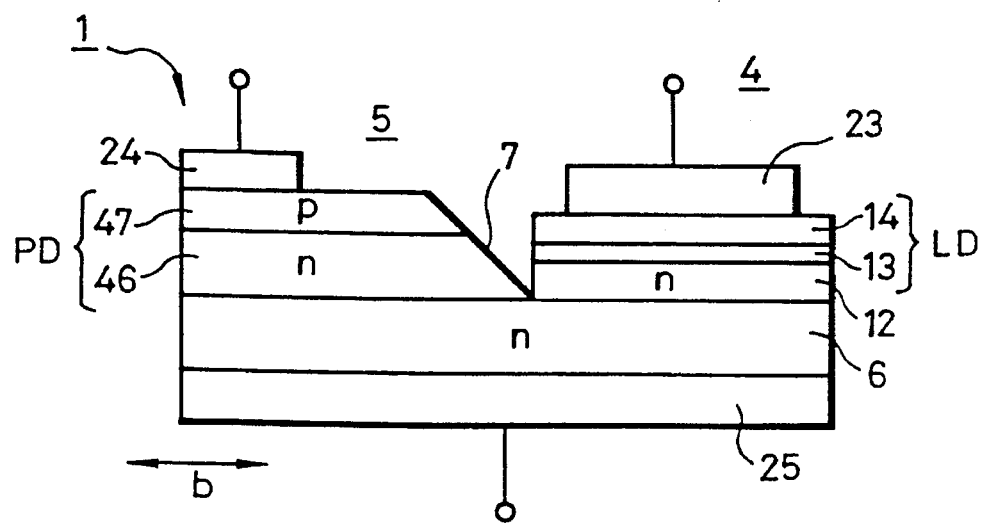

As shown in FIG. 4C, the mask layer 19 is removed by etching. Electrodes 23 and 24 of the semiconductor laser LD and the photodiode PD are deposited on a part of the semiconductor laser LD and the second semiconductor layer 20 in an ohmic contact fashion. Then, a common electrode 25 is deposited on the rear surface of the substrate 6 in an ohmic contact fashion.

In this case, a plane 26 formed on the semiconductor layer that was selectively and epitaxially grown on the substrate 6 of FIG. 4B, i.e., the first and second semiconductor layers 20 and 21 in an opposing relation to the resonator end face 18A becomes a specified crystal plane. For example, if the resonator length direction of the horizontal resonator of the semiconductor laser formed between the end faces 18A and 18B of the semiconductor laser, i.e., the direction shown by an arrow b in FIG. 4C is set to [011] crystal axis direction, then the opposing plane 26 is produced as an inclined plane of {111}A. If the direction b is set to [0–11] crystal axis direction, then the opposing plane 26 is produced as an inclined plane {111}B. In any case, an angle formed by the inclined plane and the plate surface of the substrate 6 becomes 54.7°. If the direction b is set to [100] crystal axis direction, then the opposing plane 26 is produced as an inclined plane {110} and forms an angle of 45° with respect to the plate surface of the substrate 6. In any case, the crystal plane is formed as the inclined plane 26 of atomic plane with satisfactory morphology.

Therefore, as shown in FIG. 4C, the inclined plane 26 formed of the specified crystal plane can be served as the reflecting mirror 7 which can reflect light emitted from the end face 18A of the horizontal resonator of the semiconductor laser so that the reflected light can travel toward a predetermined direction. According to the above-mentioned arrangement, since the reflecting mirror 7 is formed by the crystal plane, the reflecting mirror 7 is excellent in mirror finished surface property and the inclination angle of the reflecting mirror 7 can be set reliably.

Figure 5A:
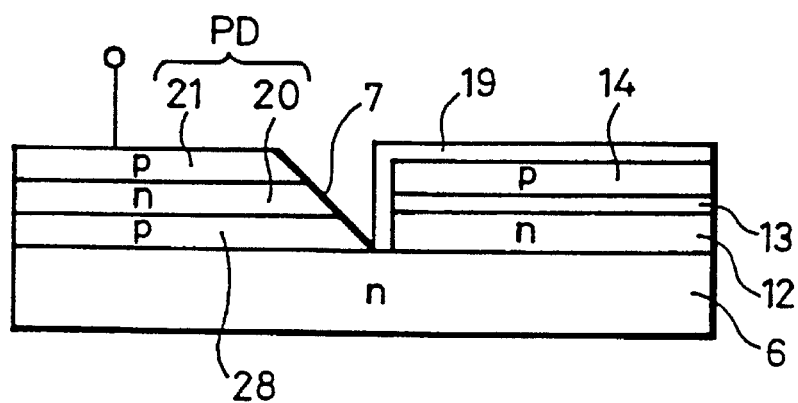
FIGS. 5A and 5B are process diagrams showing a third process of an example of a method of manufacturing an optical element used in the present invention, respectively.
Figure 5B:
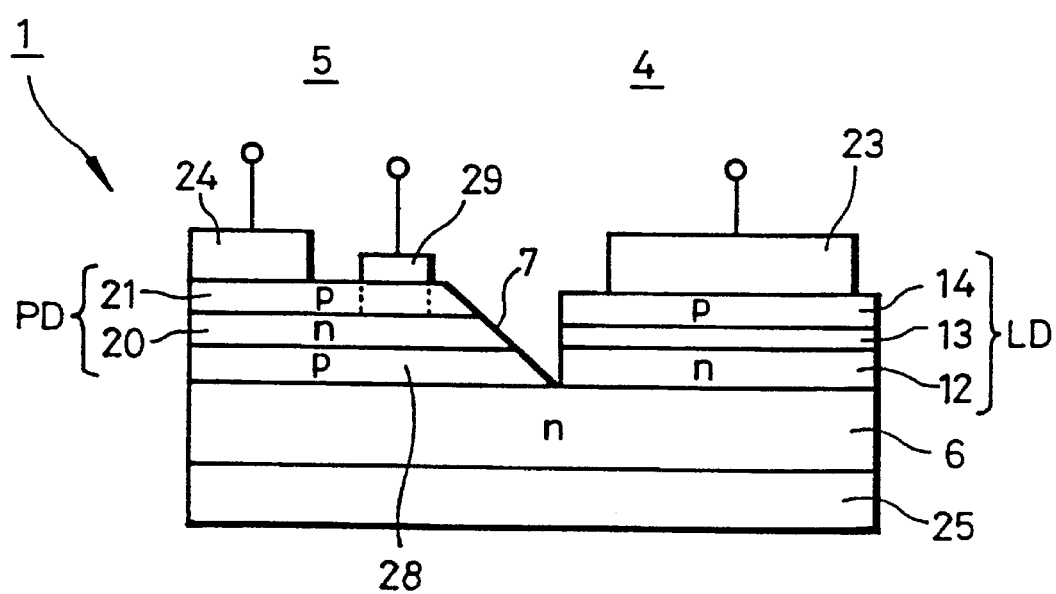

While the photodiode PD is composed of the semiconductor layer 20 of the same conductivity type as that of the substrate 6, i.e., n-type and the different conductivity-type, i.e., p-type, the semiconductor layer 21 which are sequentially and epitaxially grown on the substrate 6 as shown in the example of FIGS. 4A to 4C, the present invention is not limited thereto and the following variant is also possible. That is, in order to reduce a crosstalk component generated between the photodiode PD and the semiconductor laser LD, after the processes shown in FIGS. 3A through 3C were carried out, as shown in FIG. 5A, a semiconductor layer 28 of a second conductivity type different from that of the substrate 6, e.g., p-type is epitaxially grown on the substrate 6 before the semiconductor layers 20 and 21 are epitaxially grown on the substrate 6. Then, the semiconductor layers. 20 and 21 forming the photodiode PD can be epitaxially grown on the substrate 6 through the semiconductor layer 28. In this case, as shown in FIG. 5B, a part of the upper semiconductor layer 21 is removed to expose a part of the lower semiconductor layer 20 to the outside by etching. Then, an electrode 29 is independently deposited on the exposed portion of the lower semiconductor layer 20 in an ohmic contact fashion and the two electrodes of the photodiode PD are led out independently. Thus, the semiconductor laser LD is separated by the semiconductor layer 28.

While the light-emitting portion 4 and the light-receiving portion 5 are juxtaposed in the example of the optical element 1 as described above, the present invention is not limited thereto and the photodiode PD can be disposed on the light-emitting portion 4 similarly.

An example of the above-mentioned case will be described together with an example of a manufacturing method thereof.

Figure 6A:
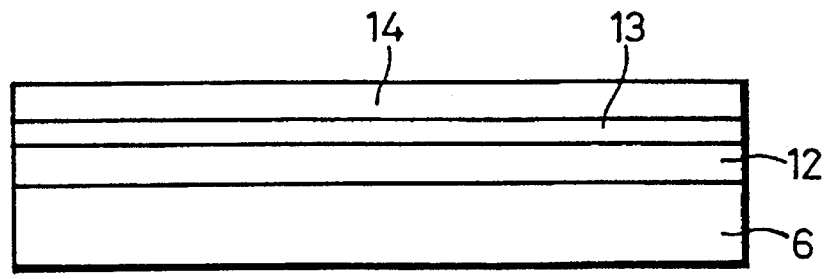
FIGS. 6A through 6C are process diagrams showing a first process of another example of a method of manufacturing an optical element used in the present invention, respectively.
Figure 6B:
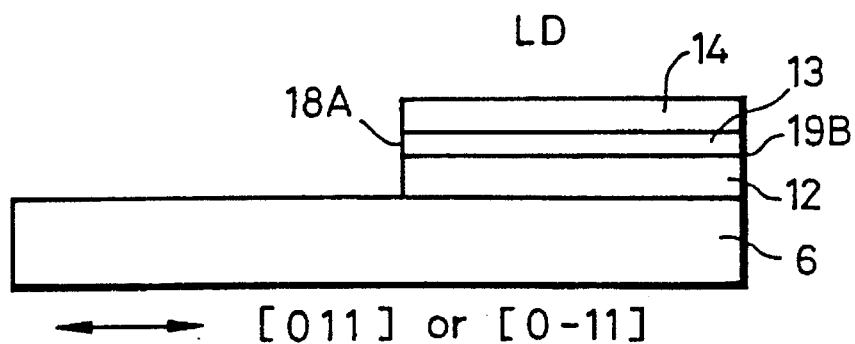

According to this example, as shown in FIGS. 6A and 6B, the semiconductor layers 12, 13, 14 constructing the semiconductor laser are formed, the semiconductor layers 12, 13 and 14 are partly removed so as to leave the portion in which the semiconductor laser LD is formed and the current blocking region is formed similarly to FIGS. 3A and 3B.

Figure 6C:
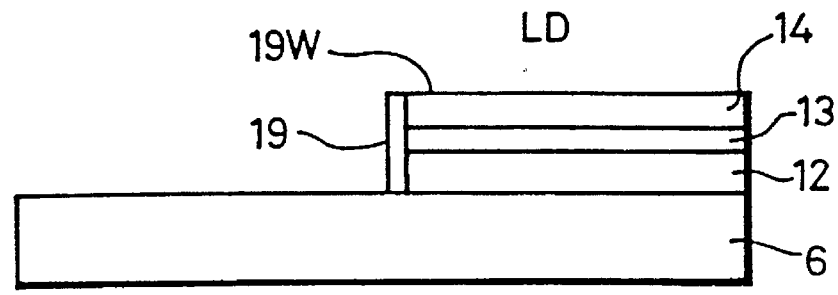

Thereafter, as shown in FIG. 6C, the mask layer 19 is formed on the end face 18A so as to form an opening 19W at least on a part of the semiconductor layer 14.

Figure 7A:
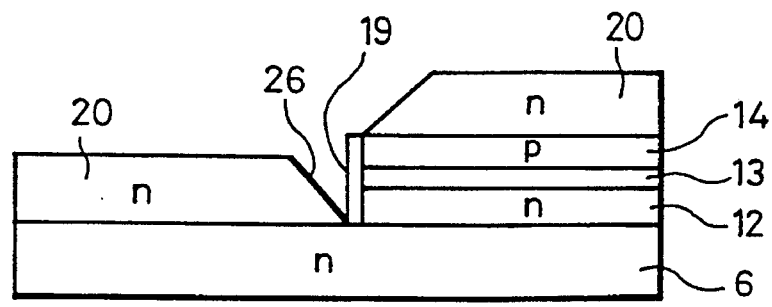
FIGS. 7A through 7C are process diagrams showing a second process of another example of a method of manufacturing an optical element used in the present invention, respectively.
Figure 7B:
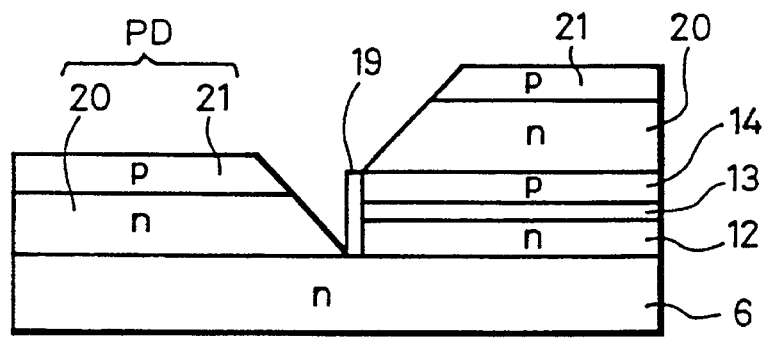
Figure 7C:
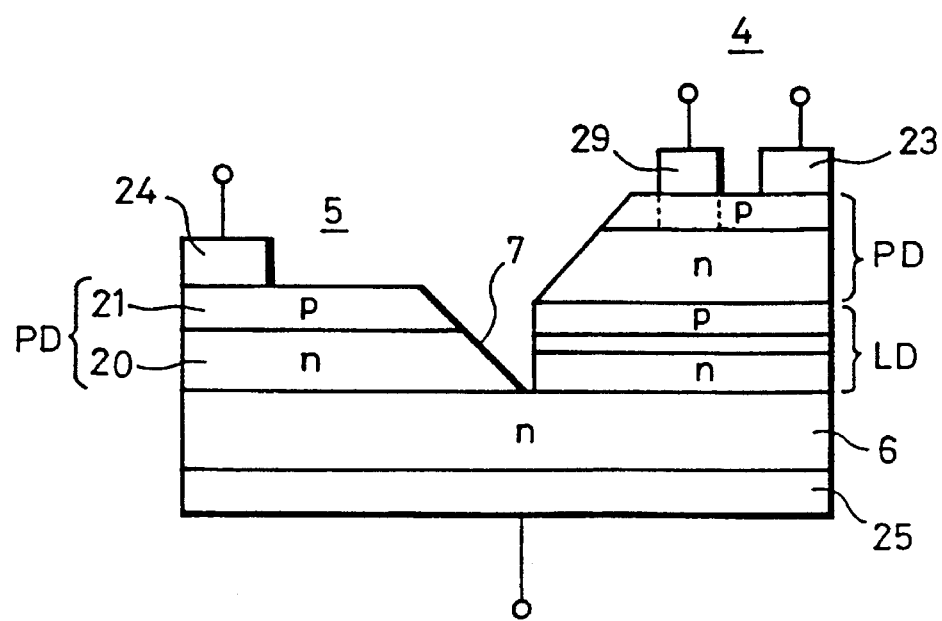

Then, as shown in FIGS. 7A, 7B and 7C, the semiconductor layers 20 and 21 are formed similarly to FIGS. 4A, 4B and 4C. At that time, the semiconductor layers 20 and 21 can be formed on the semiconductor laser LD, i.e., on the semiconductor layer 14 through the opening 19W of the mask layer 19 and therefore the photodiode PD can be formed.

Figure 8A:
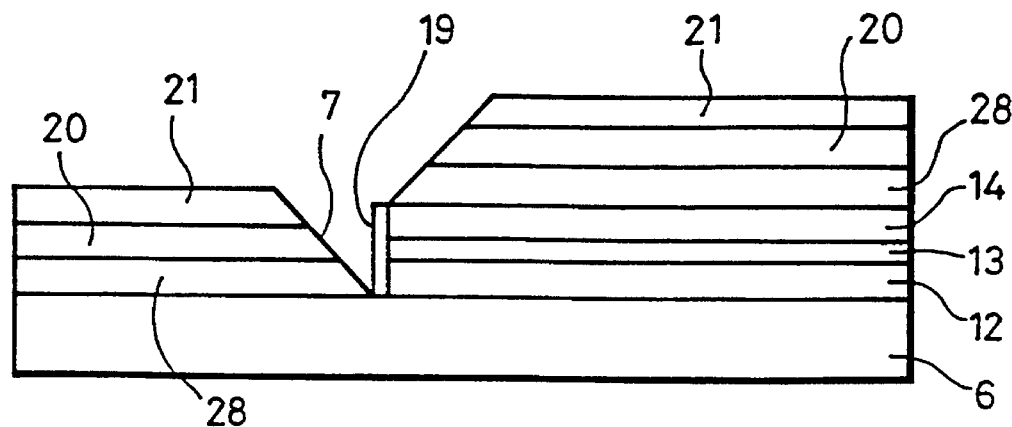
FIGS. 8A and 8B are process diagrams showing a third process of another example of a method of manufacturing an optical element used in the present invention, respectively.
Figure 8B:
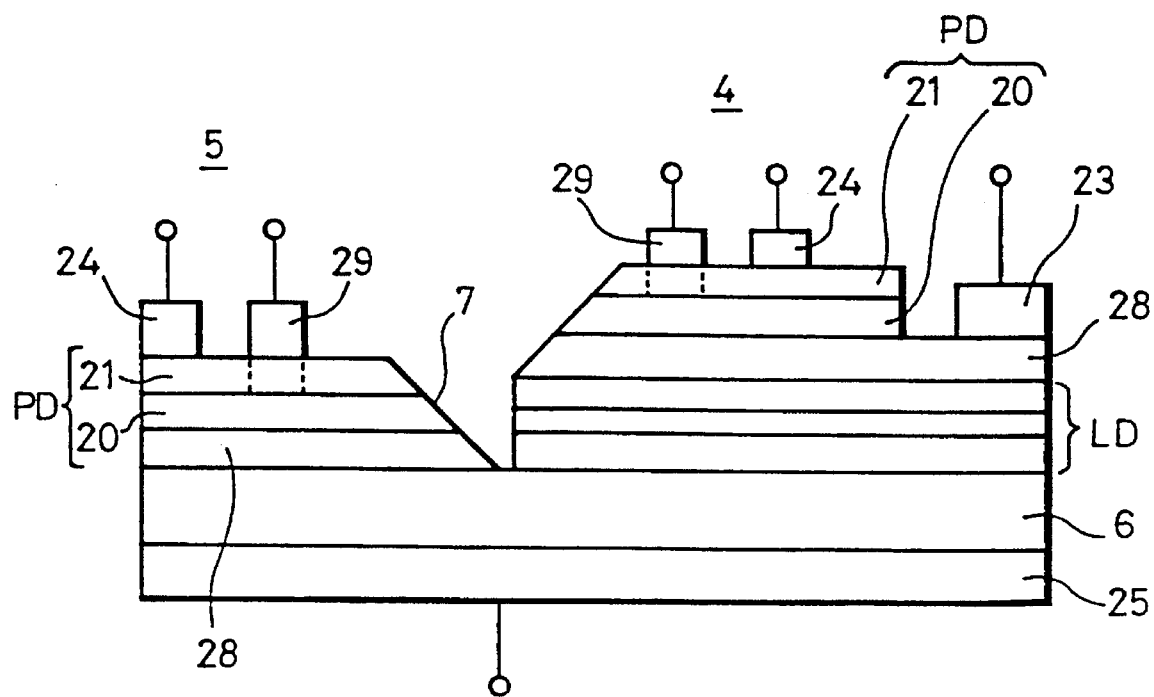

Also in this case, as shown in FIGS. 8A and 8B, after the processes shown in FIGS. 6A, 6B and 6C were executed, the semiconductor layers 20 and 21 forming the photodiode PD are epitaxially grown on the semiconductor laser LD through the semiconductor layer 28, thereby making it possible to form the photodiode PD on the semiconductor laser LD.

In FIGS. 6A to 6C through FIGS. 8A and 8B, elements and parts identical to those of FIGS. 3A to 3C through FIGS. 5A and 5B are marked with the same references and therefore need not be described in detail.

The above-mentioned selective MOCVD might be a methyl MOCVD using TMG (trimethyl gallium) as a gallium raw material gas or ethyl MOCVD using TEG (triethyl gallium) as a gallium raw material gas. In the example of the optical element 1, if the semiconductor layers 20, 21 forming the photodiode and the semiconductor layer 28 formed under the semiconductor layers 20, 21 are all formed of GaAs layers, then these semiconductor layers 20, 21 and 28 can satisfactorily be formed by atmospheric pressure MOCVD and a low pressure MOCVD. However, if at least one of the semiconductor layers 20, 21 and 28 is formed of AlGaAs semiconductor layer in accordance with some requirements, the semiconductor layer is epitaxially grown by low pressure MOCVD.

The light-emitting portion 4 and the light-receiving portion 5 can be variously modified in structure and layout. Further, it is needless to say that the conductivity types of the respective portions can be reversed.

While the semiconductor laser of the light-emitting portion 4, for example, is formed on the first and second cladding layers 12, 14 and the active layer 13 as described above, the present invention is not limited thereto and the following variant is also possible. That is, the semiconductor layer may include guide layers across the active layer or may include a capping layer formed on the second cladding layer. Further, as in a semiconductor laser described in Japanese laid-open patent publication No. 3-76218, it is possible to form a semiconductor laser of a so-called SDH (separate double heterojunction) structure. According to the SDH structure, a stripe ridge extending in the [011] direction is formed on a semiconductor substrate having a {100} crystal plane as a major surface. A {111}B plane whose growth rate in the upper oblique direction is low is crystallized on the ridge from its edge portion extended in the stripe direction by epitaxially growing a first cladding layer, an active layer, a second cladding layer or the like on the semiconductor substrate. Then, a semiconductor laser portion having a triangular cross section formed by laminating the first cladding layer, the active layer and the second cladding layer sandwiched by the inclined surface of the {111}B plane is separated from the epitaxially-grown semiconductor layer on the groove on both sides of the ridge of other portion.

Figure 9:
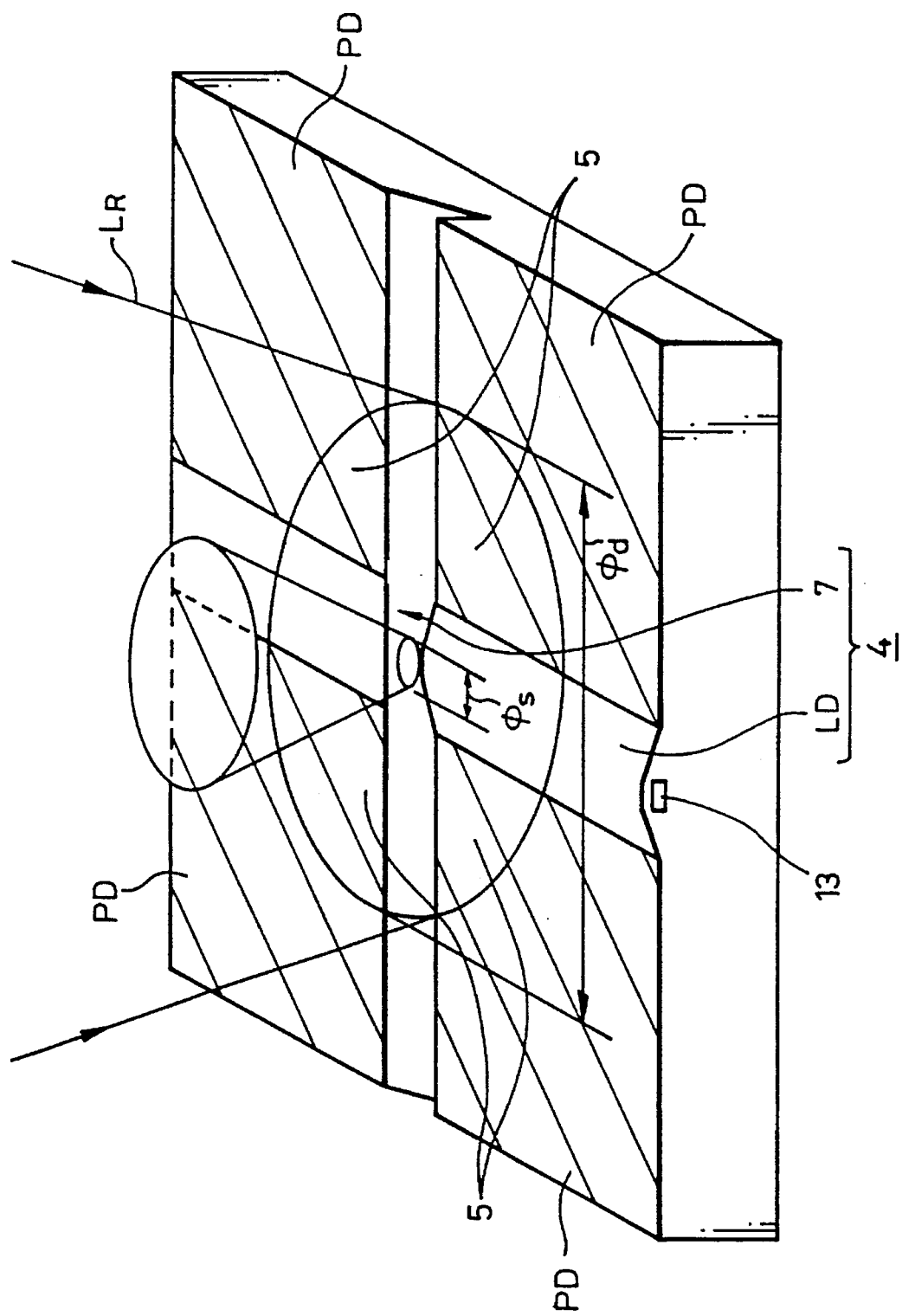
FIG. 9 is a schematic perspective view showing another example of an optical element used in the present invention.

Furthermore, while there can be provided the single photodiode PD as described above, the present invention is not limited thereto and it is possible to form a photodiode by a plurality of divided photodiode portions. FIG. 9 shows a schematic arrangement of such a photodiode. As shown in FIG. 9, the semiconductor laser LD forming the light-emitting portion 4 is formed of the above ridge-shaped SDH structure. The reflecting mirror 7 formed by the crystal plane shown in FIGS. 3A, 3B, 3C through FIGS. 8A, 8B is formed in an opposing relation to a light exit end face of the horizontal resonator formed of the active layer 13. Light emitted from the semiconductor laser LD is reflected by the reflecting mirror 7 and traveled toward a radiated portion (not shown). There are provided a plurality of photodiodes, e.g., four divided photodiodes PD around the semiconductor laser LD.

An optical device according to the present invention is formed by using the above-mentioned optical element 1.

Figure 10:
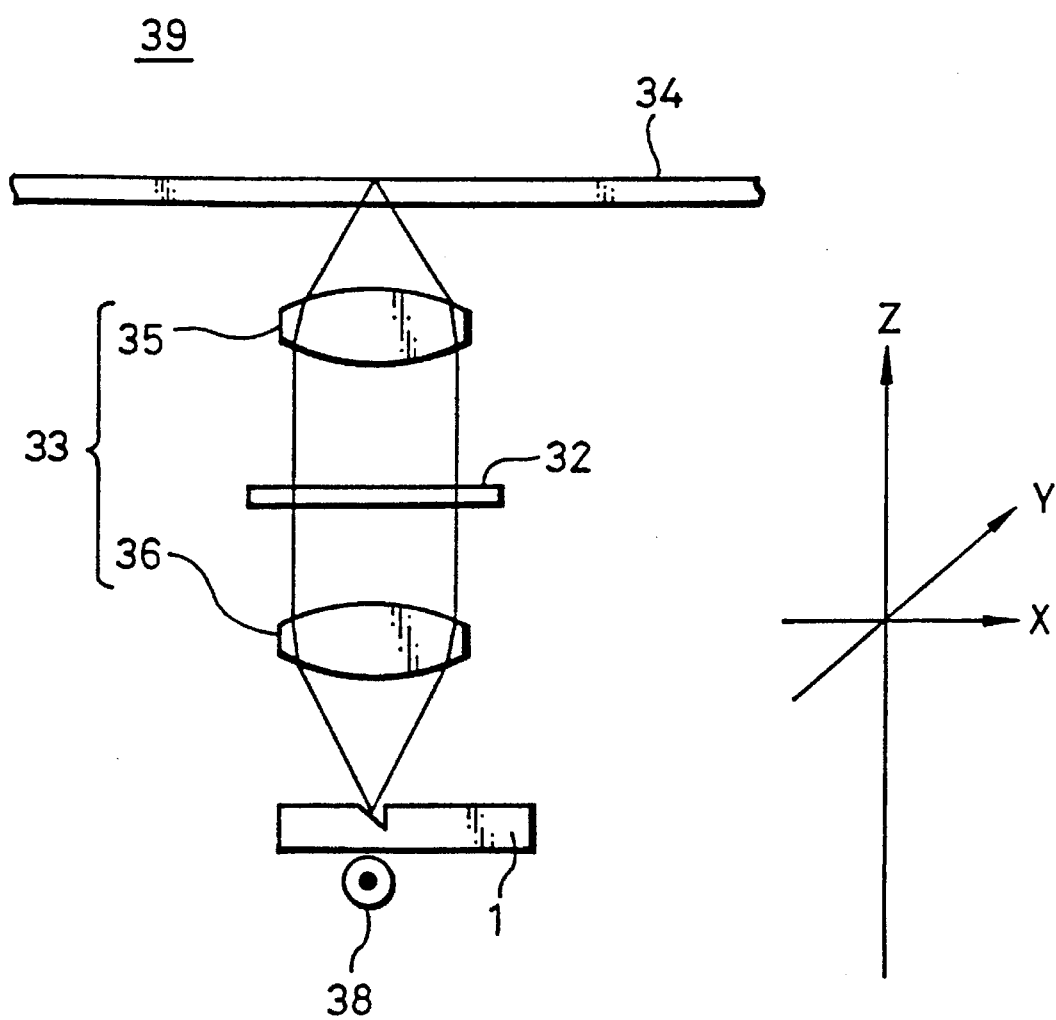
FIG. 10 is a schematic diagram showing an arrangement of an optical device according to a first embodiment of the present invention.

FIG. 10 shows an optical device according to a first embodiment of the present invention.

According to this embodiment, as shown in FIG. 10, an optical element 39 is composed of an optical element 1 of an integrated structure in which the light-emitting portion 4 and the light-receiving portion 5 are closely disposed on the common substrate 6, a polarizing means 32 and a converging means 33. Light emitted from the light-emitting portion 4 on the optical element 1 is converged and radiated on a magneto-optical medium, e.g., a magneto-optical disc 34 through the polarizing means 32. Reflected-back light reflected on the magneto-optical disc 34 is again traveled through the polarizing means 32 and received by the light-receiving portion 5 on the optical element 1.

The polarizing means 32 might be a polarizing plate having a polarization selective transmittance characteristic in which transmittances with respect to axes perpendicular to each other are different. In this embodiment, the polarizing plate 32 is formed of a polarizing plate (e.g., Lamipol) having a polarization selective transmittance characteristic in which a transmittance with respect to the Y-axis direction in FIG. 10 is 1 and a transmittance with respect to the X-axis direction is T (T<1). The polarizing means 32 is disposed such that a polarization direction 38 of light emitted from the light-emitting portion 4 of the optical element 1 and the Y-axis direction of the polarizing means 32 are displaced from each other by $\theta_1$.

The converging means 33 is composed of a converging optical lens, i.e., an objective lens 35 opposing the magneto-optical disc 34 and a collimator lens 36 disposed between the optical element 1 and the polarizing means 32.

The optical element 1 is located such that the light-emitting portion 4 of the optical element 1 is disposed at the focus position of the converging optical lens 33. To be more concrete, the optical element 1 is disposed such that a so-called waist of light emitted from the semiconductor laser LD is located at the confocal position. Moreover, the magneto-optical disc 34 is located at the other focus position of the converging optical lens 33.

In the optical device 39 thus arranged, light emitted from the light-emitting portion 4 of the optical element 1 (emitted light having the polarization direction 38 perpendicular to the sheet of drawing of FIG. 10) is traveled through the collimator lens 36 and the polarizing means 32 and converged and radiated on the magneto-optical disc 34 through the objective lens 35. A plane of polarization of light radiated on the magneto-optical disc 34 is rotated by Kerr effect corresponding to recorded information. Reflected-back light reflected on the magneto-optical disc 34 is again traveled through the polarizing means 32, i.e., traveled along the same optical path of the emitted light and received by the light-receiving portion 5 disposed near the confocal position on the optical element 1.

Because the Y-axis direction with the transmittance 1 of the polarizing means 32 and the polarization direction of light emitted from the light-emitting portion 4 are shifted by $\theta_1$, the reflected-back light from the magneto-optical disc 34 is introduced into and returned from the polarizing means 32, whereby an intensity of light introduced into the light-receiving portion 5 is changed in response to a signal to detect a magneto-optical signal, i.e., an RF (high frequency) signal which is a reproduced output corresponding to information from the magneto-optical disc 34.

Figure 11:
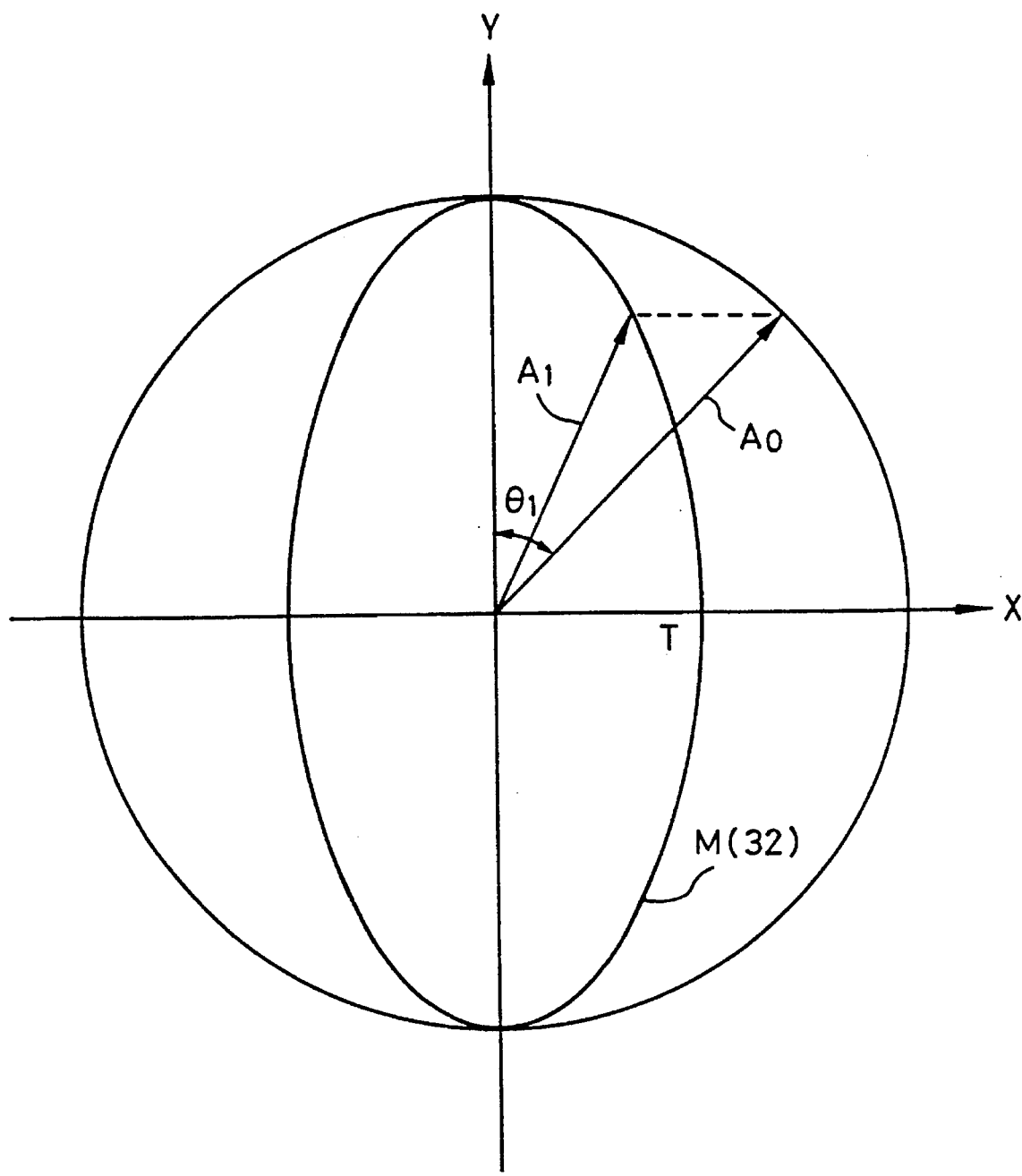
FIG. 11 is a schematic diagram used to explain a polarization direction and an intensity of outward light.
Figure 12:
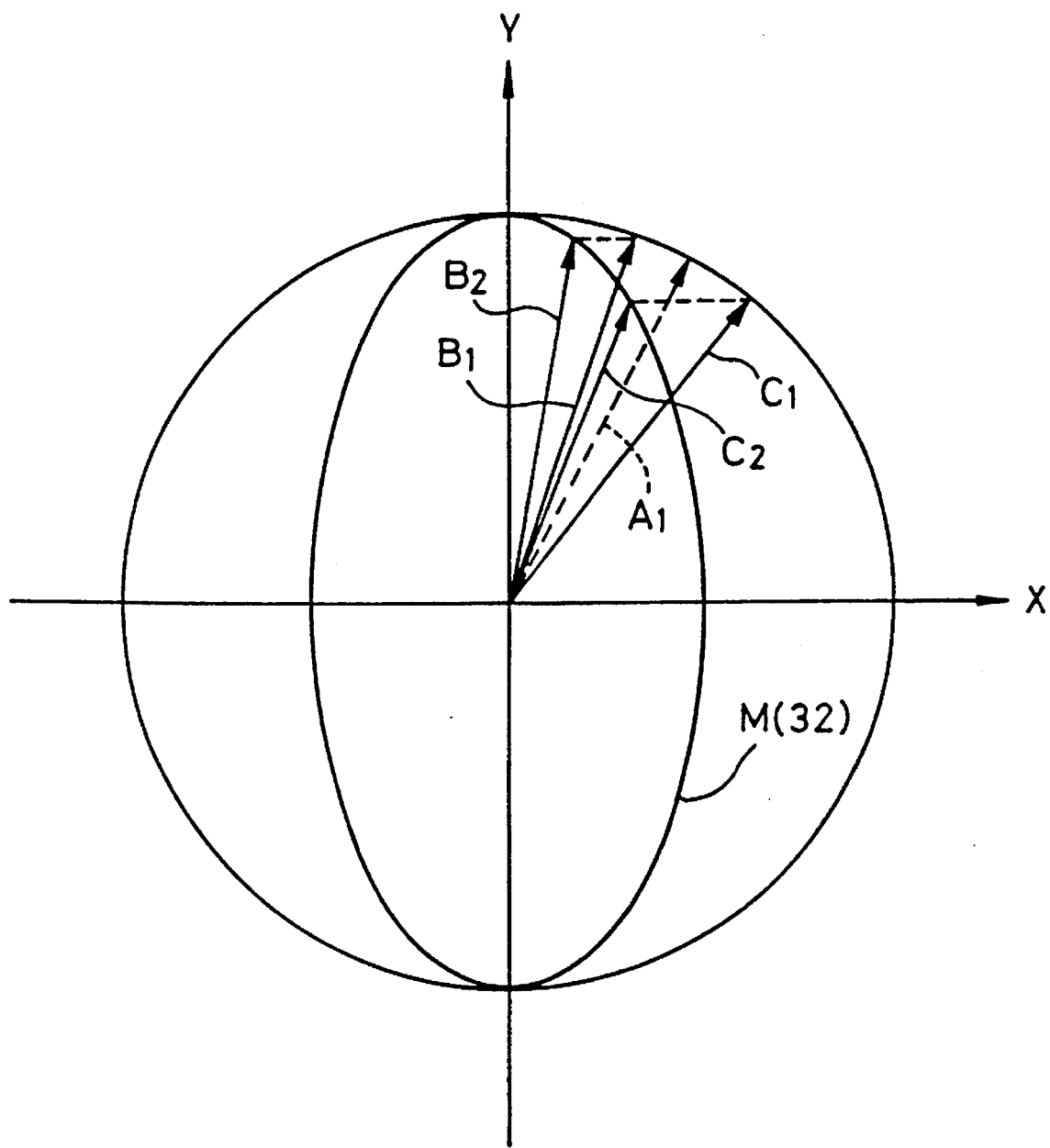
FIG. 12 is a schematic diagram used to explain a polarization direction and an intensity of inward light.

Specifically, this will be described with reference to FIGS. 11 and 12 in which a polarization direction of linearly polarized light and amplitude intensity of light are represented by vectors on a two-dimensional plane. As shown in FIG. 11 which is concerned with outward light, light emitted from the light-emitting portion 4 has a polarization direction and an intensity shown by a vector $A_0$. This outward emitted light ($A_0$) is passed through the polarizing plate 32 shifted from the emitted light ($A_0$) by $\theta_1$, i.e., the polarizing plate 32 having a polarization selective transmittance characteristic M in which the transmittance relative to the Y-axis direction is 1 and the transmittance with respect to the X-axis direction is T (T<1). Therefore, the outward light that had passed the polarizing plate 32 has a polarization direction and an intensity shown by a vector $A_1$.

This outward light $A_1$ is introduced into the magneto-optical disc 34 and reflected on the disc surface of the magneto-optical disc 34. As shown in FIG. 12 which is concerned with inward light, reflected-back light (inward light) added with a −1 signal due to Kerr effect from the disc surface has a polarization direction and an intensity shown by a vector Then, when this reflected-back light B1 again passes the polarizing plate 32 which is similarly shifted by $\theta_1$, the inward light that had passed the polarizing plate 32 has a polarization direction and an intensity represented by a vector $B_2$.

Reflected-back light (inward light) added with a +1 signal, for example, due to Kerr effect from the disc surface has a polarization direction and an intensity represented by a vector $C_1$. When this reflected-back light $C_1$ is passed through the same polarizing plate 32, this inward light that had passed the polarizing plate 32 has a polarization direction and an intensity shown by a vector $C_2$.

Accordingly, an intensity difference occurs between the reflected-back light $B_2$ added with the −1 signal and the reflected-back light $C_2$ added with the +1 signal. Therefore, if the light-receiving portion 5 (photodiode PD) detects only the change of intensity of light then a magneto-optical signal (RF signal) can be read out.

When the Y-axis direction of the polarizing means 32 is shifted from the polarization direction of light emitted from the light-emitting portion 4 by $\theta_1$, a polarization direction $\theta_2$ of light that had passed the polarizing means 32 is expressed by the following equation (1):

$$\theta_2 = T_{tan}^{-1}(T_{tan}\theta_1) \tag{1}$$

Reflected-back light (intensity I) from the magneto-optical disc 34 on which a magneto-optical signal is recorded has changes of Kerr rotation angles $\pm\phi$. Thus, intensities $I_+$ and $I_-$ of light passed again the polarizing means 32 are expressed by the following equation (2):

$$I_+ = I \frac{\cos(\theta_2 + \phi)}{\cos[\tan^{-1}\{T_{tan}(\theta_2 + \phi)\}]} \tag{2}$$

$$I_- = I \frac{\cos(\theta_2 - \phi)}{\cos[\tan^{-1}\{T_{tan}(\theta - \phi)\}]}$$

When T=0.5, $\theta_1$=45° and $\phi$=0.5°, an intensity difference between $I_+$ and $I_-$ becomes 0.65% and the magneto-optical signal can be detected.

According to this embodiment, since the optical device 39 includes the optical element 1 in which the light-emitting portion 4 and the light-receiving portion 5 are closely integrated on the common substrate 6 in a monolithic fashion, the number of optical assemblies can be reduced and the overall arrangement of the optical device can be simplified and miniaturized.

While the magneto-optical pickup in which the optical assemblies are assembled in a hybrid fashion is unable to strictly locate the light-receiving element at the confocal position of the converging lens, the inventive optical device becomes able to locate the light-receiving portion 5 near the confocal position in the order of 1μ by using the optical element 1. Therefore, it is possible to provide a small magneto-optical pickup with high alignment accuracy.

Figure 13:
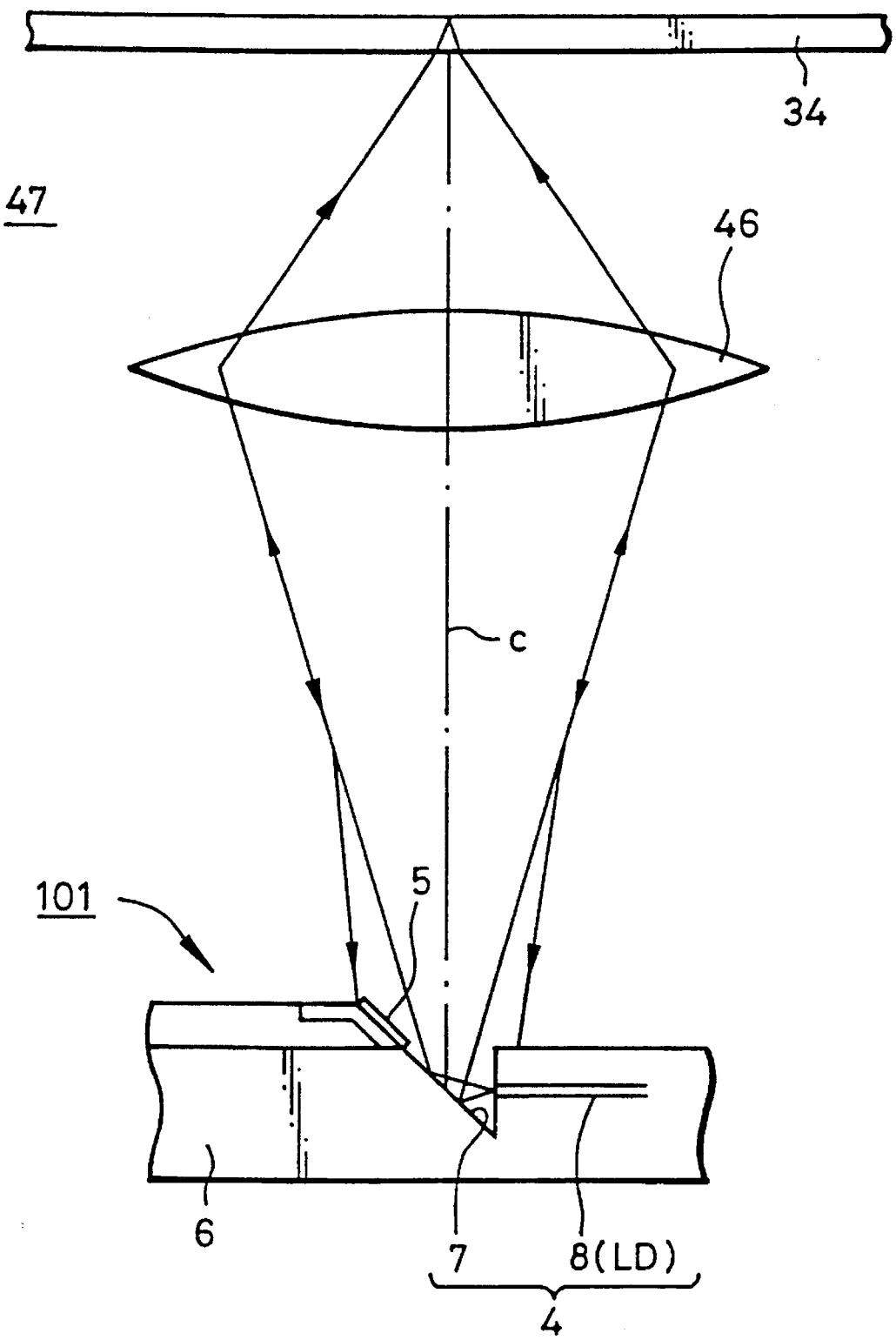
FIG. 13 is a schematic diagram showing an optical device according to a second embodiment of the present invention.
Figure 14:
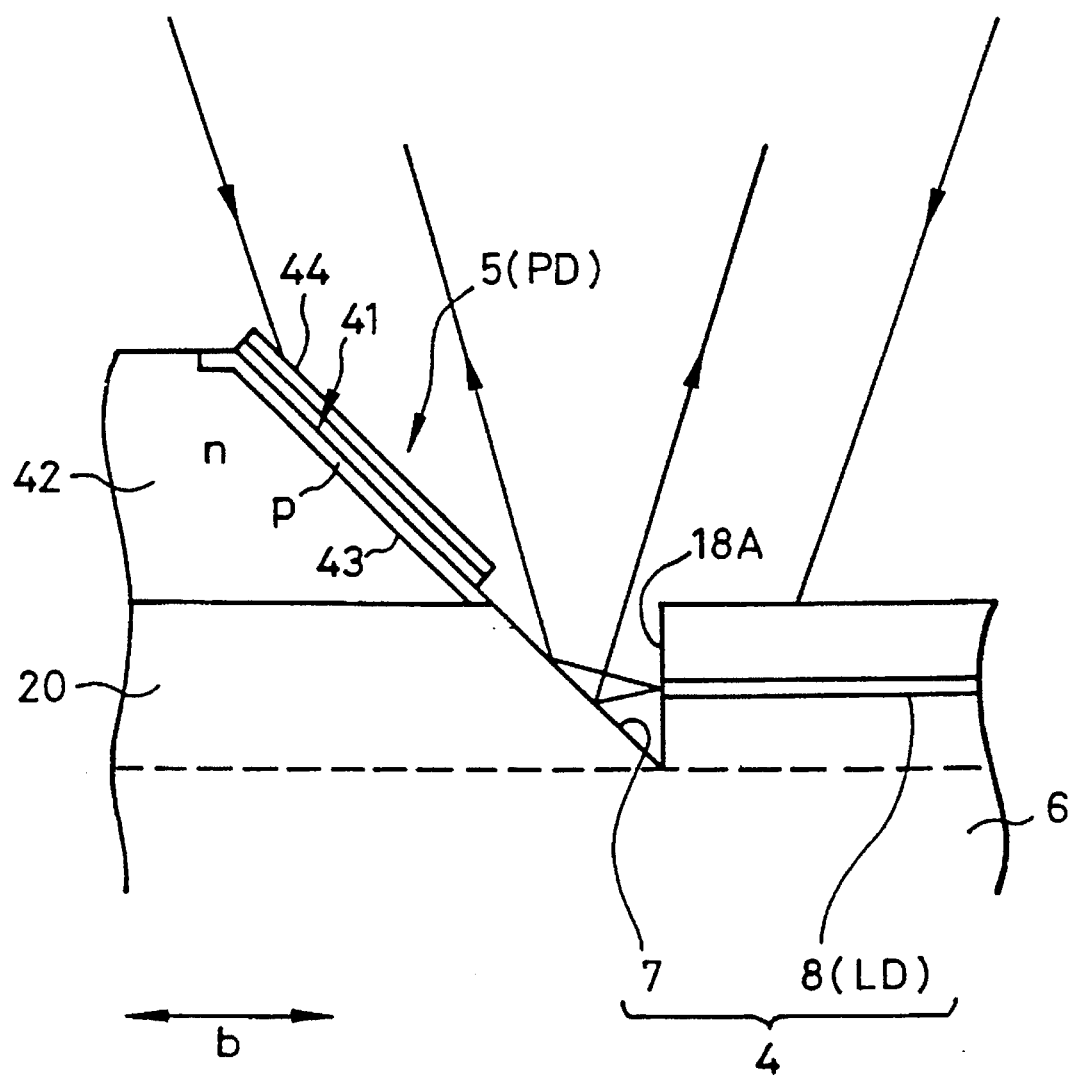
FIG. 14 is a diagram showing a main portion of FIG. 13 in an enlarged scale.

FIGS. 13 and 14 show an optical device according to a second embodiment of the present invention.

An inventive optical device 47 includes an optical element 101 having a polarization selective transmittance function on the surface of a light-receiving portion.

As shown in FIG. 13, the inventive optical element 101 is composed of the light-emitting portion 4 formed of the semiconductor laser 8 (LD) having the horizontal resonator and the reflecting mirror 7 and the light-receiving portion 5 formed of the photodiode PD, the light-emitting portion 4 and the light-receiving portion 5 being closely formed on the common substrate 6. In particular, the light-receiving portion 5 includes a polarization selective transmittance function on the surface thereof by a light-receiving surface 41 inclined relative to the optical axis C of the reflected-back light.

As shown in FIG. 14, semiconductor layers forming a semiconductor laser are epitaxially grown on the GaAs substrate 6 of a first conductivity type, i.e., n-type having (100) crystal plane as a major surface, thereby the semiconductor laser LD having the horizontal resonator being formed. A portion in which the semiconductor laser LD is constructed is covered with an insulating layer and an inclined crystal plane whose surface opposing the resonator end face 18A is specified, i.e., n-type semiconductor layer 20 which becomes the reflecting mirror 7 is formed by selective MOCVD. Further, an n-type semiconductor layer 42 having an inclined crystal plane 41 is formed by further continuing selective MOCVD. Then, a second conductivity type, e.g., p-type layer 43 is formed by some suitable processes such as diffusion and selective crystal growth, covering the inclined crystal plane 41 of n-type semiconductor layer. Thus, the photodiode PD is formed. In other words, the inclined crystal plane 41 becomes a light-receiving surface of this photodiode PD.

In this case, if the direction shown by an arrow b in FIG. 14 is taken as a [011] crystal axis direction, then the light-receiving surface 41 of the light receiving portion 5 including the reflection surface 7 is produced as an inclined plane of {111}A. If the direction b is taken as a [0–11] crystal axis direction, then the light-receiving surface 41 is produced as an inclined plane of {111}B. In any cases, the angle between the inclined plane and the plate surface of the substrate 6 becomes 54.7°. If the direction b is taken as a [100] crystal axis direction, then the light-receiving surface 41 is produced as an inclined plane of {110}. An angle between such inclined plane and the surface of the substrate 6 becomes 45°.

In the light-receiving portion 5, since the light-receiving surface 41 is inclined relative to the optical axis of the reflected-back light, a transmittance and a reflectivity are changed with the polarization direction of the reflected-back light obliquely introduced into the light-receiving surface 41, the light-receiving surface itself has a polarization selective transmittance function.

It is possible to improve a polarization sensitivity characteristic by depositing a dielectric multilayer film 44 on the inclined light-receiving surface 41.

Further, it is possible to form a metal layer with much more excellent reflectivity on a crystal plane which becomes a reflecting mirror.

According to this embodiment, as shown in FIG. 13, the optical device 47 includes the optical element 101 in which the light-receiving portion 5 with the polarization selective transmittance function provided when the light-receiving surface 41 is inclined with respect to the optical axis of the reflected-back light and the light-emitting portion 4 are closely integrated on the common substrate 6 and the converging means 46. Therefore, light emitted from the light-emitting portion 4 on the optical element 101 is converged and radiated on the magneto-optical disc 34 through the converging means 46. Reflected-back light reflected on the magneto-optical disc 34 is obliquely introduced into and received by the light-receiving portion 5 on the optical element 101.

The converging means 46 includes an objective lens opposing the magneto-optical disc 34. The converging means 46 may include a collimator lens, when necessary.

Similarly as described above, the optical element 101 is disposed such that the light-emitting portion, i.e., a so-called waist of light emitted from the semiconductor laser LD is located at one focus position of the converging means 46. Also, the magneto-optical disc 34 is located at the other focus position of the converging means 46.

In the optical device 47 thus arranged, light emitted from the light-emitting portion 4 of the optical element 101 is converged and radiated on the magneto-optical disc 34 through the objective lens 46. A polarization plane of light radiated on the magneto-optical disc 34 is rotated due to Kerr effect corresponding to recorded information. Reflected-back light reflected on the magneto-optical disc 34 is obliquely introduced into and received by the light-receiving surface 41 of the light-receiving portion 5 disposed near the confocal position on the optical element 101. The transmittance is changed depending on the polarization direction of the reflected-back light, whereby the magneto-optical signal (RF signal) can be obtained from the light-receiving portion 5.

Since the optical device 47 includes the optical element 101 in which the light-emitting portion 4 and the light-receiving portion 5 are closely integrated to each other and the light-receiving portion 5 includes the polarization selective transmittance function, optical assemblies can be reduced and the overall arrangement of the optical device can be simplified and miniaturized without using the polarizing means, such as a prism at all.

Therefore, it is possible to provide an inexpensive magneto-optical pickup of very simple structure with high alignment accuracy.

Figure 15:
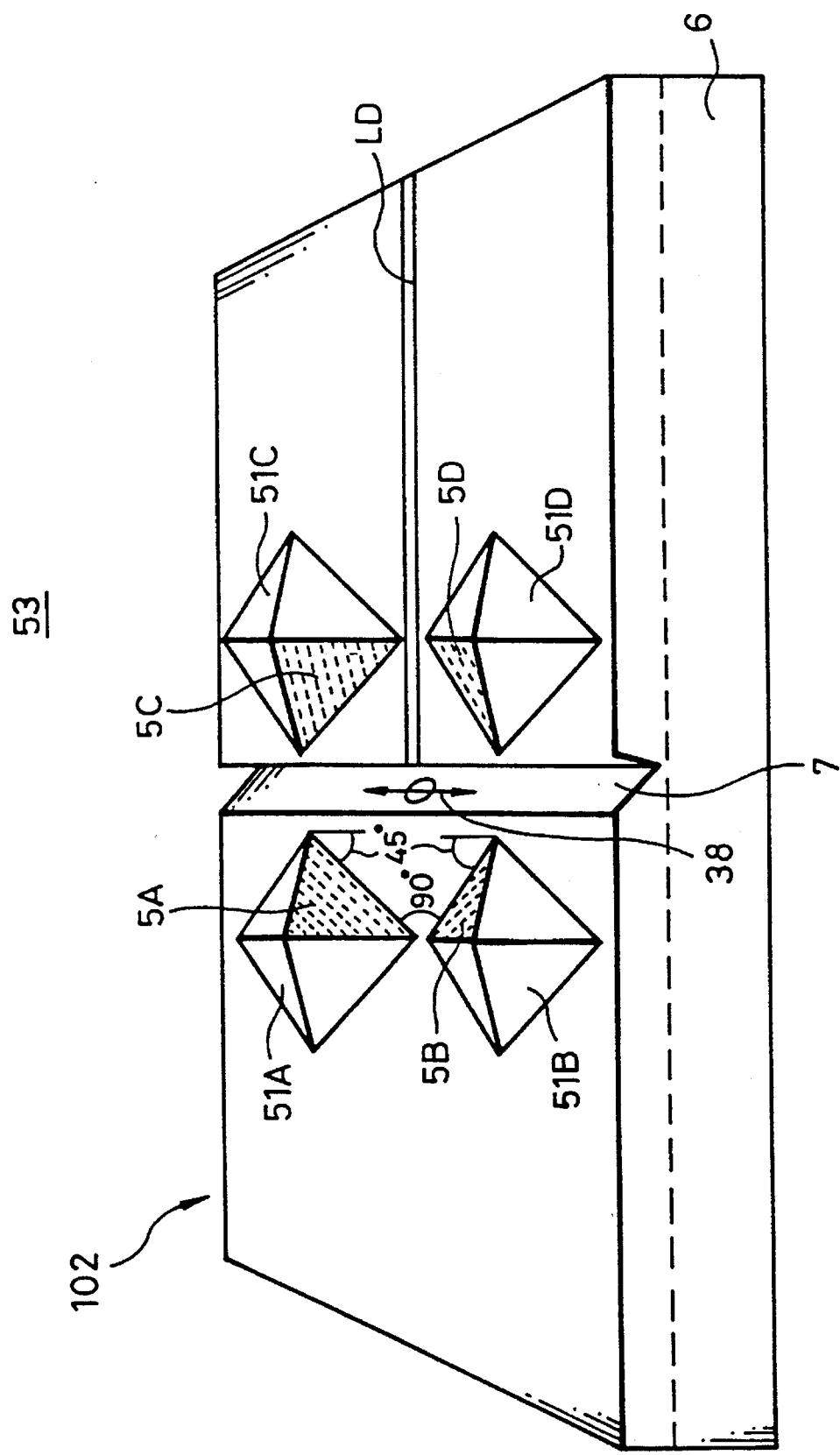
FIG. 15 is a schematic perspective view showing an optical device (particularly its optical element) according to a third embodiment of the present invention.

FIG. 15 shows an optical device according to a third embodiment of the present invention. As shown in FIG. 15, an optical device 53 includes a plurality of divided light-receiving portions 5 on the optical element 102. Divided light-receiving portions 5 have different polarization selective transmittance characteristics and the optical device 53 can detect a magneto-optical signal (RF signal) by a differential detection method.

The inventive optical element 102 is composed of the light-emitting portion 4 formed of the semiconductor laser LD having the common horizontal resonator and the reflecting mirror 7 and the light-receiving portion 5 formed of the photodiode PD which are located close to each other. In particular, the light-receiving portion 5 has the light-receiving surfaces (shown hatched) inclined relative to the optical axis of the reflected-back light so that the surfaces of the light-receiving portions can have the polarization selective transmittance functions. Also, pairs of light-receiving portions having different polarization selective transmittance characteristics, in this embodiment, two pairs of light-receiving portions 5 [5A, 5B, 5C, 5D] are separately disposed.

As shown in FIG. 15, a semiconductor laser LD having a horizontal resonator is formed on a GaAs substrate 6 whose major surface is a first conductivity type, e.g., n-type (100) crystal plane by epitaxially growing semiconductor layers constructing a semiconductor laser. A portion in which the semiconductor laser LD is formed is covered with the insulating layer and an n-type semiconductor layer 20 whose surface opposing the resonator end face 18A becomes a specified crystal plane, i.e., the reflecting mirror 7 is formed by selective MOCVD.

Further, the semiconductor layer upper surface, i.e., (100) crystal plane is covered with an insulating film except the region in which a photodiode is formed and n-type semiconductor layers 51 [51A, 51B, 51C, 51D] are selectively grown on the (100) crystal plane by selective MOCVD. Then, p-type semiconductor layers are formed on one inclined surface of each semiconductor layer 51 by diffusion or selective crystal growth or the like, thereby light-receiving portions 5 [5A, 5B, 5C, 5D] formed of two pairs of photodiodes PD being formed.

Each of the semiconductor layers 51 is shaped as a quadrangular plane, in this embodiment, a quadrangular pyramid. An inclined plane of the semiconductor layer 51 becomes a {110} crystal plane or {111} crystal plane.

If the inclined plane which serves as the light-receiving surface is set to the {111} crystal plane, then a (111) plane and a (11-1) plane are rotated by 90° around the optical axis.

Accordingly, the respective light-receiving portions 5 are disposed about the position at which light emitted from the semiconductor laser LD is reflected by the reflecting mirror 7 (in other words, about the optical axis of the reflected-back light) in a point symmetry fashion. Moreover, the respective light-receiving portions 5 are disposed such that angles formed by the light-receiving surfaces of the adjacent light-receiving portions 5 become 90° and that angles between the base of each light-receiving surface and the direction perpendicular to the polarization direction 38 of the emitted light becomes 45°. A dielectric multilayer-film may be formed on each inclined light-receiving surface in order to improve a polarization sensitivity characteristic similarly to FIG. 14.

Therefore, the light-receiving portions 5A, 5D and the light-receiving portions 5B, 5C which are opposed to one another in a point symmetry fashion have the same polarization selective transmittance characteristic. The light-receiving portions 5A, 5D and the light-receiving portions 5B, 5C have different polarization selective transmittance characteristics.

According to this embodiment, the optical device 53 is composed of the optical element 102 in which pairs of light-receiving portions having the inclined light-receiving surfaces inclined relative to the optical axis of the reflected-back light, e.g., two pairs of light-receiving portions 5 [5A, 5B, 5C, 5D] and the light-emitting portion 4 are closely integrated on the common substrate 6 and the converging means 46 (not shown) similar to that of FIG. 13. In other words, in FIG. 13, the optical element 101 is replaced with the optical element 102 shown in FIG. 15.

In the optical device 53 thus arranged, light emitted from the light-emitting portion 4 of the optical element 102 is converged and radiated on the magneto-optical disc 34 through the converging means 46. Light radiated on the magneto-optical disc 34 is rotated in plane of polarization by Kerr effect corresponding to recorded information.

Reflected-back light reflected on the magneto-optical disc 34 is traveled through the same optical path as that of the emitted light and then received by the pairs of light-receiving portions 5 [5A, 5B, 5C, 5D] disposed near the confocal position on the optical element 102.

A signal component of reflected-back light that had passed the inclined light-receiving surfaces of the light-receiving portions (5A, 5D) and a signal component of reflected-back light that had passed the inclined light-receiving surfaces of the light-receiving portions (5B, 5C) become opposite in phase.

Therefore, if the detected signals from the light-receiving portions (5A, 5D) and (5B, 5C) having the different polarization selective transmittance characteristics are supplied to a differential amplifier (not shown) and the differential amplifier calculates a difference therebetween, then it is possible to obtain a magneto-optical signal (RF signal) from which a noise concerning an intensity of light was removed.

Although the magneto-optical signal (RF signal) can be detected by calculating the detected signals from a pair of light-receiving portions having different polarization selective transmittance characteristics, e.g., from the light-receiving portions 5A and 5B by the differential amplifier (not shown) in principle, when the two pairs of light-receiving portions 5 are disposed in a point symmetry fashion as shown in FIG. 13, even if a beam spot focused on the light-receiving portions 5 is skewed, then it becomes possible to detect the magneto-optical signal in a differential fashion.

According to this embodiment, since the optical device 53 is composed of the optical element 102 in which the light-receiving portion 5 having the polarization selective transmittance characteristic and the light-emitting portion 4 are integrally formed similarly to FIG. 13, the number of optical assemblies can be reduced, in particular, the polarizing means, such as the prism can be removed. Therefore, the overall arrangement of the optical device can be simplified and miniaturized more. In addition, since the magneto-optical signal is detected by a differential arrangement, an influence exerted when an intensity of light is fluctuated can be removed. Thus, the magneto-optical signal can be detected with high S/N (signal-to-noise ratio).

Accordingly, it is possible to provide an inexpensive magneto-optical pickup of very simple structure with high alignment accuracy.

Figure 16:
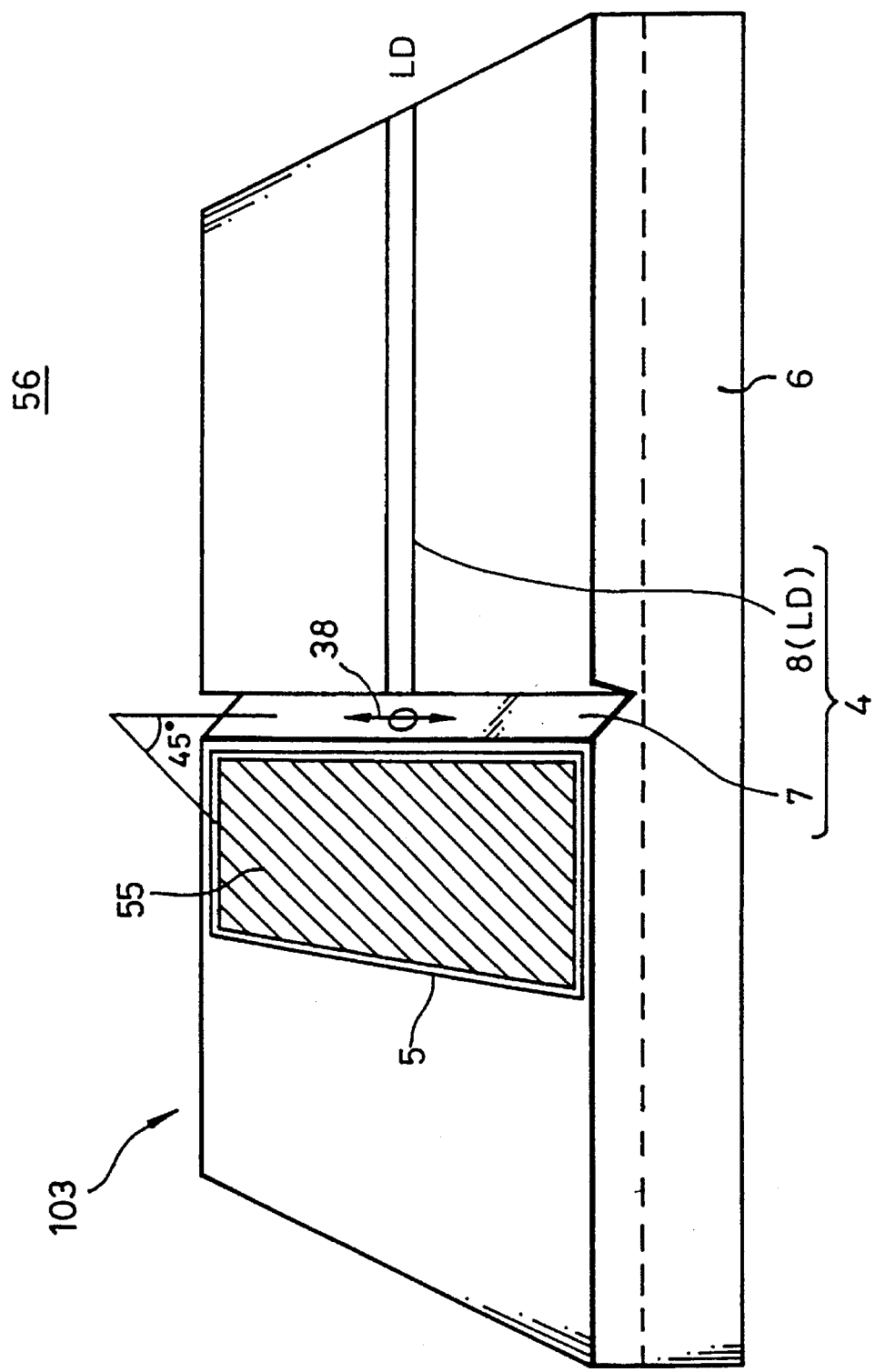
FIG. 16 is a schematic perspective view showing an optical device (particularly its optical element) according to a fourth embodiment of the present invention.

FIG. 16 shows an optical device according to a fourth embodiment of the present invention.

As shown in FIG. 16, an optical device 56 is composed of an optical element 103 which is rendered the polarization selective transmittance function by depositing a comb-shaped grating of metal thin film on the surface of the light-receiving portion.

As shown in FIG. 16, the inventive optical element 103 is composed of the common substrate 6, the light-emitting portion 4 formed of the semiconductor laser LD having the horizontal resonator and the reflecting mirror 7 and the light-receiving portion 5 formed of the photodiode PD, in which the light-emitting portion 4 and the light-receiving portion 5 are closely disposed on the common substrate 6. In particular, a comb-shaped grating 55 of thin metal film is formed on the light-receiving portion, e.g., the light-receiving surface of the light-receiving portion 5 formed on the upper surface of the semiconductor layer on the reflecting mirror 7 side directly or via an insulating film. The comb-shaped grating 55 enables the surface of the light-receiving portion 5 to have the polarization selective transmittance characteristic.

Since the comb-shaped grating 55 of metal thin film is deposited on the light-receiving surface of the light-receiving portion 5, if a width of the comb-shaped grating 55 is selected to be less than a wavelength of emitted light, then there can be obtained a polarization sensitive characteristic for linearly polarized component. A direction in which the comb-shaped grating 55 is extended is set to the direction of 45° relative to the polarization direction 38 of emitted light according to this embodiment.

A device called Lamipol is known as devices for achieving polarization sensitivity effect when light is passed therethrough. The Lamipol is composed of a laminated device formed of a dielectric material and a metal by sputtering. This laminated device is split in the vertical direction and polished in surface. When the comb-shaped grating 55 of metal thin film is formed on the surface of the light receiving portion 5, the above-mentioned arrangement becomes equivalent to the Lamipol.

If a semiconductor process such as electron beam lithography is used, then a device having similar function can be formed on the surface of the semiconductor. In this case, the light-receiving portion 5 having the polarization selective transmittance characteristic and the light-emitting portion 4 can be formed on the completely same plane.

According to this embodiment, the optical device 56 includes the optical element 103 of the integrated structure in which the light-receiving portion 5 having the polarization selective transmittance characteristic formed of the comb-shaped grating 55 and the light-emitting portion 4 are closely disposed on the common substrate 6 and the converging means 46 similar to that shown in FIG. 13. Specifically, in FIG. 13, the optical element 101 is replaced with an optical element 103 shown in FIG. 16.

In the optical device 56 thus arranged, light emitted from the light-emitting portion 4 of the optical element 103 is converged and radiated on the magneto-optical disc 34 through the converging means 64. Light radiated on the magneto-optical disc 34 is rotated in plane of polarization due to Kerr effect corresponding to recorded information. Reflected-back light reflected on the magneto-optical disc 34 is traveled through the same optical path of the emitted light and received at the light-receiving portion 5 disposed near the confocal position on the optical element 103 through the thin metal film comb-shaped grating 55 formed on the surface of the light-receiving portion 5. The light-receiving portion 5 generates a magneto-optical signal (RF signal).

According to the present invention, the optical device 56 uses the optical element 103 on which the light-emitting portion 4 and the light-receiving portion 5 are closely fabricated to each other. In addition, the surface of the light-receiving portion 5 is given the polarization selective transmittance characteristic by the comb-shaped grating 55. Therefore, the number of optical assemblies can be reduced and the polarizing means, such as a prism can be omitted thoroughly. Thus, the overall arrangement of the optical device can be simplified and miniaturized more.

Accordingly, it is possible to provide an inexpensive magneto-optical pickup of very simple structure with high alignment accuracy.

Figure 17:
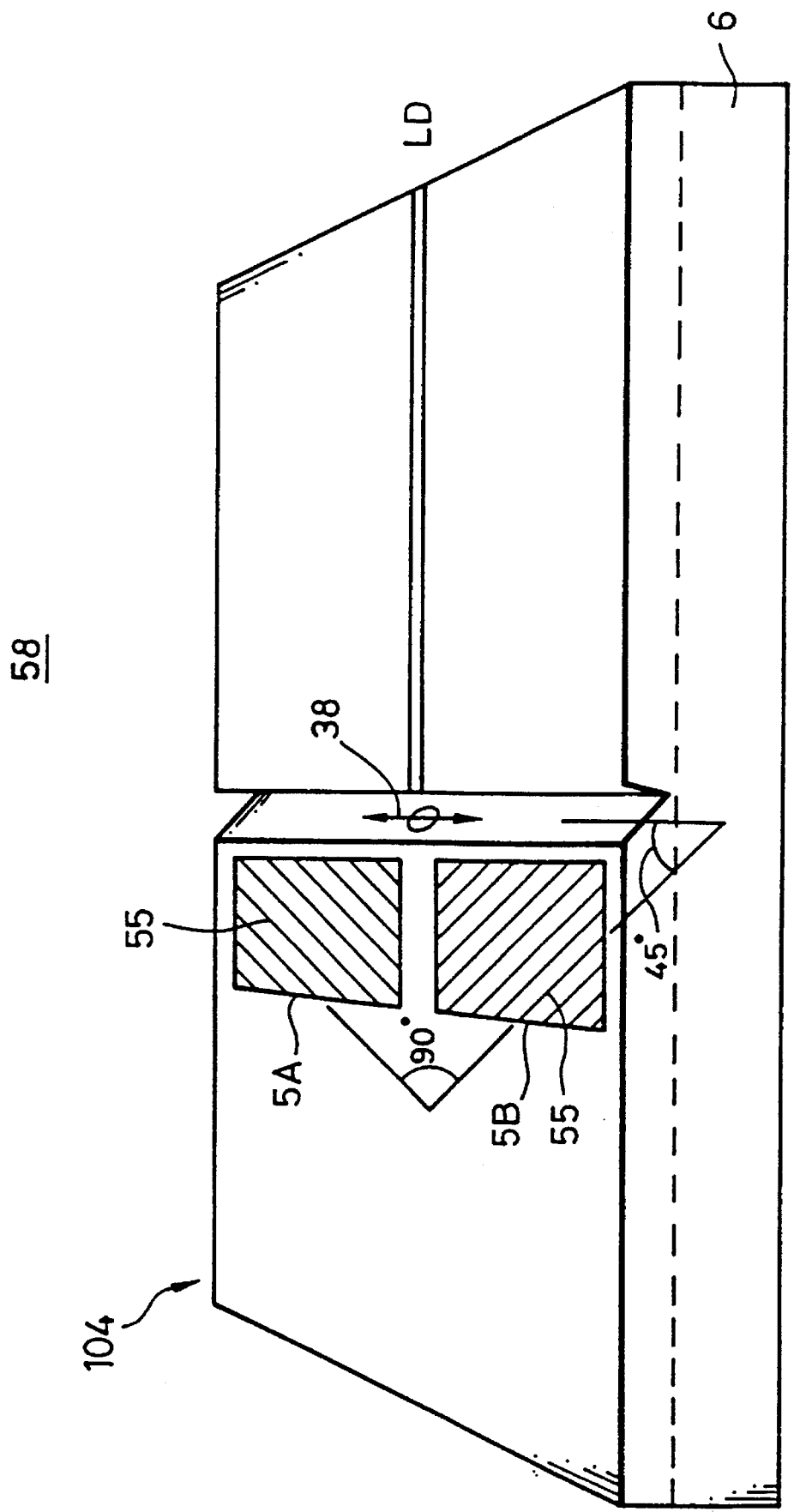
FIG. 17 is a schematic perspective view showing an optical device (particularly its optical element) according to a fifth embodiment of the present invention.

FIG. 17 shows an optical device according to a fifth embodiment of the present invention.

An optical device 58 can detect a magneto-optical signal (RF signal) by a light-receiving portion having a polarization sensitive characteristic by the comb-shaped grating 55 shown in FIG. 16 in a differential fashion.

An inventive optical element 104 includes the light-emitting portion 4 formed of the semiconductor laser LD having the horizontal resonator and the reflecting mirror 7 and the light-receiving portion 5 formed of the photodiode PD, the light-emitting portion 4 and the light-receiving portion 5 being disposed close to each other. In particular, the optical element 104 includes a pair of light-receiving portions 5 [5A, 5B] and metal thin film comb-shaped gratings 55 having different grating directions deposited on the light-receiving surfaces of the light-receiving portions 5A and 5B directly or through an insulating film. Thus, the light-receiving portions 5A, 5B have different polarization selective transmittance characteristics on the surfaces thereof.

In this embodiment, the grating directions of the metal thin film comb-shaped gratings 55 are made different from each other by 90°. Also, the grating directions of the comb-shaped gratings 55 are selected to be 45° relative to the polarization direction 38 of the emitted light.

According to this embodiment, the optical device 58 includes the above-mentioned optical element 104 and the converging means 46 similar to FIG. 13. Specifically, in FIG. 13, the optical element 101 is replaced with the optical element 104 shown in FIG. 17.

According to the optical device 58 thus arranged, light converged and radiated on the magneto-optical disc 34 through the converging means 46 from the light-emitting portion 4 of the optical element 104 is rotated in plane of polarization by Kerr effect corresponding to recorded information. Then, reflected-back light reflected on the magneto-optical disc 34 is traveled through the same optical path as that of the emitted light and received by the pair of light-receiving portions 5A, 5B disposed near the confocal position on the optical element 104 through the comb-shaped gratings 55 formed on the surfaces of the light-receiving portions 5A, 5B.

A signal component of reflected-back light passed through the comb-shaped grating 55 of the light-receiving portion 5A and a signal component of a reflected-back light passed through the comb-shaped grating 55 having a direction different from that of the comb-shaped grating 55 on the light-receiving portion 5A by 90° become opposite to each other in phase.

Therefore, if the detected signals from the light-receiving portions 5A, 5B are supplied to a differential amplifier (not shown) which then calculates a difference between the two detected signals in a differential fashion, then it is possible to obtain a magneto-optical signal (RF signal) whose noise concerning an intensity of light is removed.

The optical device 58 thus arranged uses the optical element 104 in which the light-receiving portion 5 and the light-emitting portion 4 are integrally formed on the common substrate 6. Furthermore, the polarization selective transmittance characteristic can be provided on the surfaces of the light-receiving portions 5 [5A, 5B] by the comb-shaped gratings 55. Therefore, the number of optical assemblies can be reduced and the polarizing means, such as a prism can be omitted. Thus, the overall arrangement of the optical device can be simplified and miniaturized. Further, since the magneto-optical signal is detected by the differential arrangement in a differential fashion, an influence exerted by the fluctuation of an intensity of light can be removed and a magneto-optical signal can be detected with a high S/N (signal-to-noise ratio).

Therefore, also in accordance with this embodiment, it is possible to provide an inexpensive magneto-optical pickup of very simple structure with high alignment accuracy.

Figure 18:
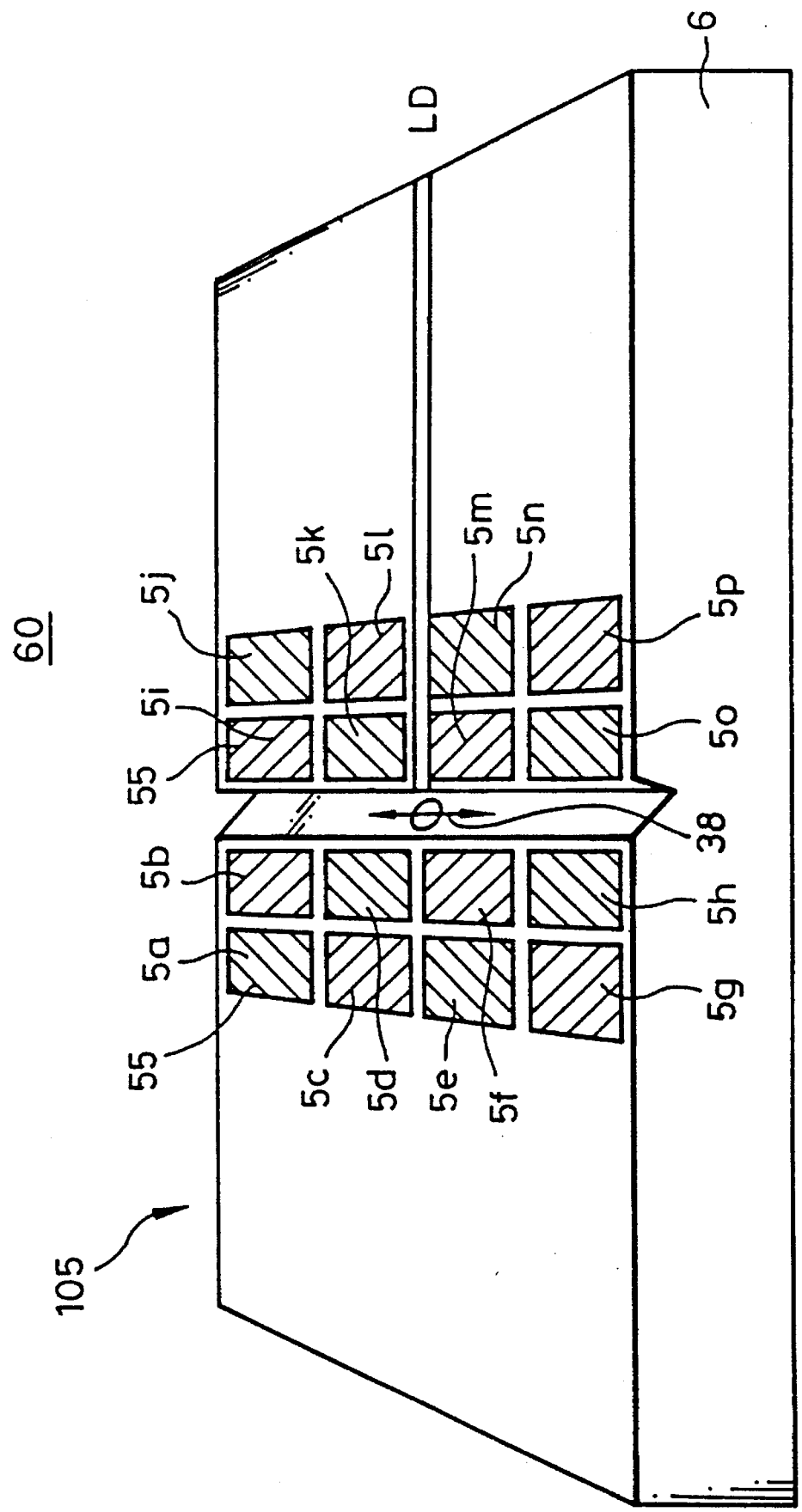
FIG. 18 is a schematic perspective view showing an optical device (particularly its optical element) according to a sixth embodiment of the present invention.

FIG. 18 shows an optical device according to a sixth embodiment of the present invention.

An inventive optical element 105 includes a plurality of sets of pairs of light-receiving portions 5 having different polarization selective transmittance characteristics in which metal thin film comb-shaped gratings 55 having grating directions different from each other by 90° are deposited on the light-receiving surfaces shown in FIG. 15, in this embodiment, 8 set of light-receiving portions [5a, 5b, 5c, 5d, 5e, 5f, 5g, 5h, 5i, 5j, 5k, 5l, 5m, 5n, 5o, 5p].

The 8 sets of light-receiving portions 5 are each arranged in four sets on the semiconductor layer surfaces of the horizontal resonator side and the reflecting mirror side about the position at which light emitted from the semiconductor laser LD is reflected on the reflecting mirror 7. Also, the light-receiving portions having the comb-shaped gratings 55 of the same grating directions are arranged in a checker pattern fashion.

According to this embodiment, an optical device 60 is composed of the optical element 105 and the converging means 46 similar to that of FIG. 13. Specifically, in FIG. 11, the optical element 101 is replaced with the optical element 105 shown in FIG. 18.

An operation of the optical device 60 thus arranged is similar to that of the optical device 58 shown in FIG. 17. A signal component of reflected-backlight that had passed the comb-shaped gratings 55 of the light-receiving portions (5a, 5d, 5e, 5h, 5j, 5k, 5n, 5o) and a signal component of reflected-back light that had passed the comb-shaped gratings 55 of the light-receiving portions (5b, 5c, 5f, 5g, 5i, 5l, 5m, 5p) are opposite in phase. Therefore, if the detected signals from the light-receiving portions (5a, 5d, 5e, 5h, 5j, 5k, 5n, 5o) and the light-receiving portions (5b, 5c, 5f, 5g, 5i, 5l, 5m, 5p) are supplied to the differential amplifier (not shown) which then calculates a difference between these detected signals, then it is possible to obtain the magneto-optical signal (RF signal).

According to this embodiment, since the light-receiving portions of the comb-shaped gratings 55 of the same grating directions are disposed in a checker pattern fashion, even if the shape of the beam spot focused on the light-receiving portion 5 on the optical element 105 is skewed, such as when a skew occurs in the optical system or an astigmatic difference occurs in light emitted from the semiconductor laser LD, it is possible to accurately detect the magneto-optical signal in a differential fashion.

According to the optical device 60, since the optical device 60 is composed of the optical element 105 similarly to the aforesaid embodiments, the polarizing means, such as the prism can be omitted and the number of optical assemblies can be reduced. Further, the overall arrangement of the optical device can be simplified and miniaturized. Furthermore, it is possible to provide an inexpensive magneto-optical pickup of very simple structure with high alignment accuracy.

In the examples shown in FIGS. 10, 13, 15, 16, 17 and 18, since the light-receiving portion 5 on the optical elements 1, 101, 102, 103 and 104 are each composed of a plurality of divided photodiodes PD, it is possible to detect the servo signal by the light-receiving portion 5.

As described above, according to the optical device of the present invention, since the number of optical assemblies can be reduced, the arrangement of the optical device can be simplified with high alignment accuracy, and the overall arrangement of the optical device can be miniaturized.

Furthermore, since the light-receiving portion on the optical device has the polarization function, the optical device can be extremely simplified in arrangement without using the polarizing means such as the prism at all. Therefore, as the magneto-optical pickup device for detecting a magneto-optical signal from the magneto-optical medium, such as the magneto-optical disc, there can be realized a miniaturized magneto-optical pickup device with high alignment accuracy inexpensively.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An optical device for detecting a magneto-optical signal from a magneto-optical medium, comprising:

an optical element having a common substrate, a light-emitting portion and a light-receiving portion, said light-emitting portion and said light-receiving portion being closely disposed and integrally formed on said common substrate; and converging means arranged between said substrate and said magneto-optical medium, said converging means having a confocal point located at said light emitting portion, for converging reflected light onto said confocal point; and said light-receiving portion receiving and detecting near said confocal point reflected-back light obtained from said magneto-optical medium via said converging means after light emitted from said light-emitting portion was reflected on said magneto-optical medium, wherein said light-receiving portion on said optical element receives said reflected-back light from said magneto-optical medium to detect a magneto-optical signal.

2. An optical device according to claim 1, further comprising polarizing means having different transmittances with respect to axes perpendicular to each other and wherein said emitted light and said reflected-back light are passed through said polarizing means.

3. An optical device according to claim 1, wherein said light-receiving portion of said optical element includes a light-receiving surface inclined to an optical axis of said reflected-back light and said light-receiving portion has on its surface a polarization selective transmittance function.

4. An optical device according to claim 1, wherein said optical element includes a pair of light receiving portions having different polarization selective transmittance characteristics and a differential structure formed of said pair of light-receiving portions detects a magneto-optical signal in a differential fashion.

5. An optical device according to claim 1, wherein said optical element has a metal comb-shaped grating formed on the surface of said light-receiving portion and a magneto-optical signal is detected by a polarization selective transmittance characteristic brought about by said comb-shaped grating.

6. An optical device according to claim 1, wherein said optical element includes a pair of light-receiving portions formed thereon, said pair of light-receiving portions have on their surfaces metal comb-shaped gratings having different functions to provide different polarization selective transmittance characteristics and a differential structure formed of said pair of light-receiving portions detects a magneto-optical signal in a differential fashion.

7. An optical device for detecting a magneto-optical signal from a magneto-optical medium, comprising:

an optical element having a common substrate, a light-emitting portion and a light-receiving portion, said light-emitting portion, said light-emitting portion and said light-receiving portion being closely disposed on said common substrate and said light-receiving portion receiving and detecting near a confocal point reflected-back light obtained from a magneto-optical medium after light emitted from said light-emitting portion was reflected on said magneto-optical medium, wherein said light-receiving portion on said optical element receives said reflected-back light from said magneto-optical medium to detect a magneto-optical signal; and wherein said optical element includes a plurality of sets of pairs of light-receiving portions having metal comb-shaped gratings having different directions to provide different polarization selective transmittance characteristics and light-receiving portions having metal comb-shaped gratings of the same direction are arranged in a checker pattern fashion.

8. An optical device according to claim 1, wherein said optical element includes a plurality of sets of pairs of light-receiving portions having metal comb-shaped gratings having different directions to provide different polarization selective transmittance characteristics and light-receiving portions having metal comb-shaped gratings of the same direction are arranged in a checker pattern fashion.

9. An optical device according to claim 1, wherein said light emitting portion comprises:

a semiconductor laser having opposing resonator end faces, said semiconductor laser formed of semiconductor layers grown epitaxially on said substrate and etched to form said resonator end faces, and a further semiconductor layer grown epitaxially on said substrate opposite one of said end faces, said further semiconductor layer having an inclined face facing said one end face, said inclined surface defined by a select crystal plane of said further semiconductor layer.

10. An optical device according to claim 1, wherein said converging means comprises an objective lens disposed adjacent said magneto-optical medium, a collimator lens disposed adjacent said light emitting portion, and a polarizing plate arranged between said objective lens and said collimator lens.

11. An optical device according to claim 3, wherein said light receiving surface is inclined along a crystal plane of a semiconductor layer epitaxially grown on said substrate.

12. An optical device according to claim 3, wherein said light-receiving portion comprises a plurality of additional light-receiving surfaces adjacent said light emitting portion and arranged in different planes, said additional surfaces having thereon polarization selective transmittance functions.

13. An optical device according to claim 12, wherein said plurality of additional light-receiving surfaces and said light-receiving surface are each formed as part of a quadrangle pyramid and each of said additional surfaces and said surface are composed of one triangular portion of each of said pyramids and are formed along the crystal plane of said pyramid, said pyramids formed in a rectangular grid pattern around said light emitting portion.

14. An optical device according to claim 6, wherein said metal comb-shaped gratings of said pair of light receiving portions are arranged relatively at 90 degrees.

15. An optical device according to claim 4, wherein said differential structure comprises electronic means for calculating a difference between detected signals from said pair of light receiving portions and calculating a difference between the detected signals in a differential fashion to create a magneto-optical signal whose noise component due to a fluxuating intensity of light is removed.

16. An optical device according to claim 7, wherein said differential structure comprises electronic means for calculating a difference between detected signals from said pairs of light receiving portions and calculating a difference between the detected signals in a differential fashion to create a magneto-optical signal whose noise component due to a fluxuating intensity of light is removed.

* * * * *